(12) United States Patent
Gotoh et al.

(10) Patent No.: US 9,292,146 B2
(45) Date of Patent: Mar. 22, 2016

(54) PHOTOSENSITIVE FILM, METHOD FOR PRODUCING CAPACITANCE TYPE INPUT DEVICE, CAPACITANCE TYPE INPUT DEVICE, AND IMAGE DISPLAY APPARATUS USING THE SAME

(71) Applicant: FUJIFILM Corporation, Minato-ku, Tokyo (JP)

(72) Inventors: Hidenori Gotoh, Fujinomiya (JP); Shinichi Yoshinari, Fujinomiya (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/483,969

(22) Filed: Sep. 11, 2014

(65) Prior Publication Data
US 2014/0375912 A1    Dec. 25, 2014

Related U.S. Application Data

(63) Continuation of application No. PCT/JP2013/056736, filed on Mar. 12, 2013.

(30) Foreign Application Priority Data

Mar. 15, 2012    (JP) .................................. 2012-058243

(51) Int. Cl.
*C09K 19/00*    (2006.01)
*G06F 3/044*    (2006.01)
(Continued)

(52) U.S. Cl.
CPC .............. *G06F 3/044* (2013.01); *G06F 1/1643* (2013.01); *G06F 3/041* (2013.01); *H01H 11/06* (2013.01);
(Continued)

(58) Field of Classification Search
CPC .................. G06F 3/044; G06F 1/1643; G06F 2203/04111; H03K 17/962; H03K 17/9622; H03K 2017/9613; H03K 2217/960755; H01H 11/06; Y10T 428/264; Y10T 428/1059; Y10T 428/1082; Y10T 29/49105; G03F 7/09; G03F 7/11; G03F 7/161
USPC .................. 428/1.5, 1.54, 1.55, 335; 349/12; 200/5 R; 29/622; 430/262, 263, 270.1; 345/174
See application file for complete search history.

(56) References Cited

U.S. PATENT DOCUMENTS 7,796,124 B2    9/2010  Sato et al.
8,665,226 B2    3/2014  Liu et al.
(Continued)

FOREIGN PATENT DOCUMENTS

JP    2000-098594 A    4/2000
JP    2006-023406 A    1/2006
(Continued)

OTHER PUBLICATIONS

International Search Report for PCT/JP2013/056736 dated Apr. 9, 2013.
(Continued)

*Primary Examiner* — Ruiyun Zhang
(74) *Attorney, Agent, or Firm* — Sughrue Mion, PLLC

(57) ABSTRACT

A photosensitive film having a provisional support and a photocurable resin layer, wherein the photocurable resin layer contains a white inorganic pigment, a monomer, a binder and a photopolymerization initiator, the photocurable resin layer has a thickness of from 1 to 40 μm, and the photocurable resin layer has a content of the white inorganic pigment of from 30 to 50% by mass is capable of providing a white decorative layer that is good in brightness, whiteness, reticulation, adhesion, development residue and unevenness, in a high yield.

6 Claims, 10 Drawing Sheets

(51) Int. Cl.
*G06F 3/041* (2006.01)
*G06F 1/16* (2006.01)
*H01H 11/06* (2006.01)
*H03K 17/96* (2006.01)
*G03F 7/027* (2006.01)
*G03F 7/105* (2006.01)

(52) U.S. Cl.
CPC ............ *H03K 17/9622* (2013.01); *G03F 7/027* (2013.01); *G03F 7/105* (2013.01); *H03K 2017/9613* (2013.01); *H03K 2217/960755* (2013.01); *Y10T 29/49105* (2015.01); *Y10T 428/1059* (2015.01); *Y10T 428/264* (2015.01)

(56) References Cited

U.S. PATENT DOCUMENTS

| | | | |
|---|---|---|---|
| 2004/0106061 A1* | 6/2004 | Gotoh | 430/263 |
| 2006/0160915 A1* | 7/2006 | Fuchs et al. | 522/6 |
| 2007/0165006 A1 | 7/2007 | Sato et al. | |
| 2008/0268374 A1 | 10/2008 | Tashiro et al. | |
| 2008/0309635 A1 | 12/2008 | Matsuo | |
| 2009/0207151 A1 | 8/2009 | Liu et al. | |
| 2012/0162130 A1 | 6/2012 | Liu et al. | |
| 2013/0141385 A1 | 6/2013 | Liu et al. | |
| 2013/0141386 A1 | 6/2013 | Liu et al. | |

FOREIGN PATENT DOCUMENTS

| | | | |
|---|---|---|---|
| JP | 2006-267504 A | | 10/2006 |
| JP | 2007-122326 A | | 5/2007 |
| JP | 2008-310550 A | | 12/2008 |
| JP | 2009-193587 A | | 8/2009 |
| JP | 2010-020264 A | | 1/2010 |
| JP | 2010020264 A | * | 1/2010 |
| JP | 4506785 B2 | | 7/2010 |
| JP | 2011-065171 A | | 3/2011 |
| WO | 2006/004171 A1 | | 1/2006 |

OTHER PUBLICATIONS

Written Opinion for PCT/JP2013/056736 dated Apr. 9, 2013.
International Preliminary Report on Patentability dated Sep. 16, 2014, issued by the International Bureau of WIPO in counterpart International Application No. PCT/JP2013/056736.
Office Action dated Mar. 3, 2015, issued by the Japanese Patent Office in counterpart Japanese Application No. 2013-048717.

* cited by examiner

PHOTOSENSITIVE FILM, METHOD FOR PRODUCING CAPACITANCE TYPE INPUT DEVICE, CAPACITANCE TYPE INPUT DEVICE, AND IMAGE DISPLAY APPARATUS USING THE SAME

CROSS-REFERENCE TO RELATED APPLICATIONS

This application is a continuation application of International Application No. PCT/JP2013/056736, filed Mar. 12, 2013, which in turn claims the benefit of priority from Japanese Application No. 2012-058243, filed Mar. 15, 2012, the disclosures of which Applications are incorporated by reference herein in their entirety.

BACKGROUND OF THE INVENTION

1. Field of the Invention

The present invention relates to a decorative photosensitive film for producing a capacitance type input device capable of detecting a touch position of a finger as a change of capacitance, a method for producing a capacitance type input device, a capacitance type input device obtained by the production method, and an image display apparatus equipped with the capacitance type input device as a constitutional component.

2. Background Art

In recent years, electronic equipments, such as mobile telephones, car navigation systems, personal computers, ticket vending machines and banking terminals, include ones that are equipped with a tablet type input device on a surface of a liquid crystal display device or the like, in which an indicating image is displayed on an image display region of the liquid crystal display device, and the position where the indicating image is displayed is touched with a finger, a stylus pen or the like by referring to the indicating image, thereby enabling input of information corresponding to the indicating image.

The input device (i.e., a touch-sensitive panel) includes a resistive film type, a capacitance type and the like. However, the resistive film type input device has a two-layer structure containing a film and a glass plate, in which the film is pressed down to short-circuit them, and thus has disadvantages including the narrow operative temperature range and the time-lapse deterioration.

On the other hand, the capacitance input device has such an advantage that a translucent conductive film may be simply formed on a single substrate. The capacitance input device includes, for example, such a type that has electrode patterns that extend to cross each other, and on touching the electrodes with a finger or the like, the change of the capacitance between the electrodes is detected to determine the input position (see, for example, Patent Literature 1).

The capacitance input device also includes such a type that alternating currents having the same phase and the same potential are applied to both ends of the translucent conductive film, and on forming a capacitor by touching with a finger or bringing a finger close thereto, a weak electric current flowing is detected to determine the input position. As the capacitance type input device of this type, such a capacitance type input device is disclosed that contains plural first transparent electrode patterns formed of plural pad portions formed to extend in a first direction and connected through connecting portions, and plural second transparent electrode patterns electrically insulated from the first transparent electrode patterns with an interlayer insulating layer, and formed of plural pad portions formed to extend in a direction intersecting the first direction (see, for example, Patent Literature 2). However, the capacitance type input device has a front plate laminated on the capacitance type input device produced, and thus has a problem including the large thickness and the large weight of the capacitance input device.

A capacitance type touch-sensitive panel containing a front plate having on a non-contact surface thereof a mask layer, a sensor circuit and an interlayer insulating layer, which are integrated, is disclosed (see, for example, Patent Literature 3). The capacitance type touch-sensitive panel of Patent Literature 3 has the front plate and the capacitance type input device, which are integrated to each other, and thus has a small thickness and a light weight, and a decorative layer having various color tones (such as black, white, pastel colors and metallic colors) may be provided depending on necessity between the mask layer and the front plate, among which a white decorative layer is demanded to be enhanced in brightness and whiteness.

As the method for providing the decorative layer, methods of coating a liquid resist, screen printing and the like are mainly employed.

For a smartphone and a tablet PC having a capacitance type touch-sensitive panel on a liquid crystal display device or an organic EL display device, on the other hand, ones using toughened glass represented by Gorilla Glass, available from Corning Inc., as a front panel (i.e., a surface that is touched directly with a finger) have been developed and announced.

On forming a white decorative layer on the substrate with a liquid resist or a screen printing ink for forming a decorative layer, it is necessary to perform application of the liquid resist or screen printing multiple times for forming the white decorative layer with a liquid resist or a screen printing ink having small hiding power, thereby causing such a problem that bubbles and unevenness occur, and difficulty in cost reduction due to the increased number of process steps.

CITATION LIST

Patent Literatures

Patent Literature 1: JP-A-2007-122326
Patent Literature 2: Japanese Patent No. 4,506,785
Patent Literature 3: JP-A-2009-193587

SUMMARY OF INVENTION

As a result of investigations by the present inventors, it has been found that in the case where a white decorative layer is formed by the methods described in the literatures, it is impossible to provide ones that satisfy all the characteristics including the brightness, the whiteness, the reticulation, the adhesion, the development residue and the unevenness.

It has been also found that it is difficult to provide a white decorative layer that satisfies the aforementioned characteristics, in a high yield.

A problem to be solved by the invention is to provide a photosensitive film that is capable of providing a white decorative layer that is good in the brightness, the whiteness, the reticulation, the adhesion, the development residue and the unevenness, in a high yield.

Furthermore, it is to provide a method for producing a capacitance type input device capable of producing a capacitance type input device capable of being reduced in thickness and weight using a photosensitive film that satisfies the aforementioned characteristics, through a convenient process with high quality, a capacitance type input device that is produced by the production method, and an image display apparatus that uses the capacitance type input device.

[1] A photosensitive film containing a provisional support and a photocurable resin layer, the photocurable resin layer containing at least (A) a white inorganic pigment, (B) a monomer, (C) a binder and (D) a photopolymerization initiator, the photocurable resin layer having a thickness of from 1 to 40 μm, the photocurable resin layer having a content of the white inorganic pigment of from 20 to 75% by mass based on the total solid content thereof.

[2] The photosensitive film according to the item [1], wherein the white inorganic pigment is preferably rutile titanium oxide.

[3] The photosensitive film according to the item [1] or [2], wherein a content ratio B/C of a solid content of the monomer (B) to a solid content of the binder (C) is preferably 0.4 or more.

[4] The photosensitive film according to any one of the items [1] to [3], which preferably further contains a thermoplastic resin layer between the provisional support and the photocurable resin layer.

[5] A method for producing a capacitance type input device containing a front plate and on a non-contact surface thereof the following components (1) and (3) to (5), the production method containing forming the decorative layer (1) by transferring a colored layer of the photosensitive film according to any one of the items [1] to [4] to the non-contact surface of the front plate:

(1) a decorative layer, (3) plural first transparent electrode patterns that contain plural pad portions that are formed to extend in a first direction and connected through connecting portions, (4) plural second electrode patterns that are electrically insulated from the first transparent electrode patterns, and contain plural pad portions that are formed to extend in a direction intersecting the first direction, and (5) an insulating layer that electrically insulate the first transparent electrode patterns and the second electrode patterns from each other.

[6] The method for producing a capacitance type input device according to the item [5], wherein the capacitance type input device preferably further contains (6) a conductive element that is other than the first transparent electrode patterns and the second electrode patterns and is electrically connected to at least one of the first transparent electrode patterns and the second electrode patterns.

[7] The method for producing a capacitance type input device according to the item [5] or [6], wherein the second electrode patterns are preferably transparent electrode patterns.

[8] The method for producing a capacitance type input device according to any one of the items [5] to [7], wherein (2) a mask layer is preferably further provided on a surface of the decorative layer (1) that is opposite to the front plate.

[9] The method for producing a capacitance type input device according to the item [8], wherein at least one of the first transparent electrode patterns and the second electrode patterns are preferably provided over both regions in the non-contact surface of the front plate and a surface of the mask layer that is opposite to the front plate.

[10] The method for producing a capacitance type input device according to the item [8] or [9], wherein the capacitance type input device preferably further contains the conductive element (6) that is other than the first transparent electrode patterns and the second electrode patterns and is electrically connected to at least one of the first transparent electrode patterns and the second electrode patterns, and the conductive element (6) is preferably provided at least on a surface of the mask layer that is opposite to the front plate.

[11] The method for producing a capacitance type input device according to any one of the items [5] to [10], wherein a transparent protective layer is preferably provided to cover the entire or a part of the components (1) and (3) to (5).

[12] The method for producing a capacitance type input device according to the item [11], wherein the transparent protective layer is preferably formed with a photosensitive film that contains a provisional support, a thermoplastic resin layer and a photocurable resin layer in this order.

[13] The method for producing a capacitance type input device according to any one of the items [5] to [12], wherein the capacitance type input device preferably further contains the conductive element (6) that is other than the first transparent electrode patterns and the second electrode patterns and is electrically connected to at least one of the first transparent electrode patterns and the second electrode patterns, the second electrode patterns are preferably transparent electrode patterns, and at least one of the first transparent electrode patterns, the second transparent electrode patterns and the conductive element are preferably formed by etching a transparent conductive material with an etching pattern that is formed with a photosensitive film that contains a provisional support, a thermoplastic resin layer and a photocurable resin layer in this order.

[14] The method for producing a capacitance type input device according to any one of the items [5] to [13], wherein the capacitance type input device preferably further contains the conductive element (6) that is other than the first transparent electrode patterns and the second electrode patterns and is electrically connected to at least one of the first transparent electrode patterns and the second electrode patterns, the second electrode patterns are preferably transparent electrode patterns, and at least one of the first transparent electrode patterns, the second transparent electrode patterns and the conductive element are preferably formed by transferring a conductive curable resin layer of a photosensitive film that that contains a provisional support, a thermoplastic resin layer and the conductive photocurable resin layer in this order.

[15] The method for producing a capacitance type input device according to any one of the items [5] to [14], wherein the non-contact surface of the front plate is preferably surface-treated, and the photosensitive film according to any one of the items [1] to [4] is preferably provided on the non-contact surface of the front plate having been surface-treated.

[16] The method for producing a capacitance type input device according to the item [15], wherein the front plate is preferably surface-treated with a silane compound.

[17] The method for producing a capacitance type input device according to any one of the items [5] to [16], wherein the front plate preferably has an opening in at least a part thereof.

[18] A capacitance type input device that is produced by the method for producing a capacitance type input device according to any one of the items [5] to [17].

[19] An image display apparatus containing the capacitance type input device according to the item [18] as a constitutional component.

According to the invention, there may be provided a photosensitive film that is capable of providing a white decorative layer that is good in the brightness, the whiteness, the reticulation, the adhesion, the development residue and the unevenness, in a high yield.

According to the invention, furthermore, there may be provided a method for producing a capacitance type input device capable of producing a capacitance type input device capable of being reduced in thickness and weight using a photosensitive film that satisfies the aforementioned characteristics, through a convenient process with high quality, a capacitance type input device that is produced by the production method, and an image display apparatus that uses the capacitance type input device.

DESCRIPTION OF EMBODIMENTS

Figure 1:
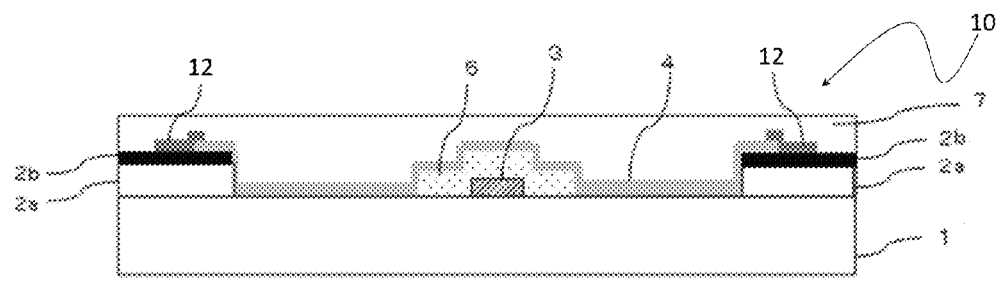
FIG. 1 is a cross sectional view showing a structure of a capacitance type input device according to the invention.

The photosensitive film, the method for producing a capacitance type input device, the capacitance type input device and the image display apparatus of the invention will be described below.

The description for the constitutional components shown below may be made with reference to representative embodiments of the invention, but the invention is not limited to the embodiments. In the description, a numerical range expressed by "from X to Y" means a range including the numerals X and Y as the lower limit and the upper limit, respectively.

Photosensitive Film

The photosensitive film of the invention contains a provisional support and a photocurable resin layer, the photocurable resin layer contains at least (A) a white inorganic pigment, (B) a monomer, (C) a binder and (D) a photopolymerization initiator, the photocurable resin layer has a thickness of from 1 to 40 μm, and the photocurable resin layer has a content of the white inorganic pigment of from 20 to 75% by mass based on the total solid content thereof.

Due to the aforementioned structure, the photosensitive film of the invention may provide a white decorative layer that is good in the brightness, the whiteness, the reticulation, the adhesion, the development residue and the unevenness, in a high yield.

The photosensitive film according to the invention has a provisional support and a photocurable resin layer, and may have a thermoplastic resin layer between the provisional support and the photocurable resin layer.

The photosensitive film used in the invention may be a negative type material or a positive type material.

Provisional Support

The provisional support used may be a material that has flexibility and does not undergo significant deformation, contraction and elongation under pressure or under pressure and heat. Examples of the support include a polyethylene terephthalate film, a cellulose triacetate film, a polystyrene film and a polycarbonate film, and among these, a biaxially stretched polyethylene terephthalate film is particularly preferred.

The thickness of the provisional support is not particularly limited and is generally in a range of from 5 to 200 μm, and preferably in a range of from 10 to 150 μm particularly in view of the handleability and the versatility.

The provisional support may be transparent and may contain dye silicon, alumina sol, a chromium salt, a zirconium salt or the like.

The provisional support may have conductivity imparted by the method described in JP-A-2005-221726 and the like.

Photocurable Resin Layer

In the photosensitive film of the invention, the photocurable resin layer contains at least (A) a white inorganic pigment, (B) a monomer, (C) a binder and (D) a photopolymerization initiator, the photocurable resin layer has a thickness of from 1 to 40 μm, and the photocurable resin layer has a content of the white inorganic pigment of from 20 to 75% by mass based on the total solid content thereof.

Thickness

The thickness of the photocurable resin layer is necessarily from 1 to 40 μm from the standpoint of enhancing the hiding power of the photocurable resin layer as a decorative layer of a capacitance type input device derived from the photosensitive film of the invention.

The thickness of the photocurable resin layer is more preferably from 1.5 to 38 μm, and particularly preferably from 1.8 to 35 μm.

Composition (A) White Inorganic Pigment

Examples of the white inorganic pigment used in the photocurable resin layer include the white pigments described in the paragraphs [0015] and [0114] of JP-A-2005-7765.

Specific preferred examples thereof include titanium oxide (rutile type), titanium oxide (anatase type), zinc oxide, lithopone, light calcium carbonate, white carbon, aluminum oxide, aluminum hydroxide and barium sulfate. Among these, titanium oxide (rutile type), titanium oxide (anatase type) and zinc oxide are more preferred, titanium oxide (rutile type) and titanium oxide (anatase type) are further preferred, and rutile type titanium oxide is still further preferred.

The surface of the titanium oxide may be subjected to a silica treatment, an alumina treatment or an organic material treatment.

According to the procedure, the titanium oxide may be suppressed in catalytic activity, thereby enhancing the heat resistance, the light resistance and the like.

The content of the white inorganic pigment of the photocurable resin layer is from 20 to 75% by mass based on the total solid content, and thereby such a decorative layer may be formed that is good in the brightness and the whiteness and satisfies the other demanded characteristics simultaneously. In the case where the photosensitive film of the invention is used for the method for producing a capacitance type input device of the invention described later, the content of the white inorganic pigment of the photocurable resin layer is necessarily from 20 to 75% by mass from the standpoint of reducing the developing time sufficiently.

The content of the white inorganic pigment of the photocurable resin layer is more preferably from 25 to 60% by mass, and further preferably from 30 to 50% by mass, based on the total solid content thereof.

The total solid content referred herein means the total mass of the non-volatile components in the photocurable resin layer except for the solvent and the like.

The white inorganic pigment (the same may be applied to the other colorants used in the mask layer described later) is used preferably in the form of a dispersion liquid. The dispersion liquid may be prepared by adding and dispersing a composition, which is obtained by mixing the white inorganic pigment and a pigment dispersant in advance, in an organic solvent (or a vehicle) described later. The vehicle herein means a portion of a medium, in which a pigment is dispersed, when a paint is in the form of liquid, and the vehicle is in the form of liquid and contains a component that is combined with the pigment to form a coated film (i.e., a binder) and a component that dissolves and dilutes the binder (i.e., an organic solvent).

The dispersing machine used for dispersing the white inorganic pigment is not particularly limited, and examples thereof include known dispersing machine, such as a kneader, a roll mill, an attritor, a super mill, a dissolver, a homomixer and a sand mill, described, for example, in K. Asakura, "Ganryo no Jiten" (Encyclopedia of Pigments), 1st ed., Item 438, Asakura Publishing Co., Ltd. (2000). The white inorganic pigment may also be finely pulverized through mechanical grinding described in the same literature, page 310.

A white inorganic pigment that is used as the white inorganic pigment used in the invention (i.e., a colorant for forming a decorative layer) preferably has an average particle diameter of primary particles of from 0.16 to 0.3 μm, more preferably from 0.18 to 0.27 μm, and particularly preferably from 0.19 to 0.25 μm, from the standpoint of the dispersion stability and the hiding power. When the average particle diameter of primary particles is less than 0.16 μm, the hiding power may be sharply lowered to expose the mask layer as the underlayer, and the viscosity may be increased. When the average particle diameter exceeds 0.3 μm, the whiteness may be lowered, simultaneously the hiding power may be sharply lowered, and the surface property of the coated layer may be deteriorated.

The term "average particle diameter of primary particles" herein means the diameter of the circle that has the same area as that of the electron micrograph, and the term "number average particle diameter" means such a value that the particle diameter is measured for many particles, and the average value of 100 particles is obtained.

In the case where the average particle diameter in a dispersion liquid or a coating liquid is measured, Laser Scattering Horiba H (produced by HORIBA Advanced Techno Co., Ltd.) may be used.

(B) Monomer

The monomer used in the photocurable layer is not particularly limited unless the monomer deviates from the substance of the invention, and a known polymerizable compound may be used.

Examples of the polymerizable compound used include the polymerizable compounds described in the paragraphs [0023] to [0024] of Japanese Patent No. 4,098,550.

In the photosensitive film of the invention, the content ratio B/C of the solid content of the monomer (B) to the solid content of the binder (C) is preferably 0.4 or more, more preferably from 0.58 to 0.95, and particularly preferably from 0.6 to 0.9.

(C) Binder

The binder used in the photocurable layer is not particularly limited unless the binder deviates from the substance of the invention, and a known polymerizable compound may be used.

In the case where the photosensitive film of the invention is a negative type material, the photocurable resin layer preferably contains an alkali-soluble resin, a polymerizable compound, and a polymerization initiator or a polymerization initiating system. In addition, a colorant, an additive and the like may be used, but the invention is not limited thereto.

Examples of the alkali-soluble resin contained in the photosensitive film used in the invention include the polymers described in the paragraph [0025] of JP-A-2011-95716, and the paragraphs [0033] to [0052] of JP-A-2010-237589.

In the case where the photosensitive film is a positive type material, the photocurable resin layer may contain the materials described in JP-A-2005-221726 and the like, but the invention is not limited thereto.

(D) Photopolymerization Initiator

Examples of the photopolymerization initiator used in the photocurable resin layer include the polymerizable compounds described in the paragraphs [0031] to [0042] of JP-A-2011-95716. Examples of the photopolymerization initiator include Irgacure 651, Irgacure184D, Irgacure 1800, Irgacure 907, Irgacure 369, Irgacure OXE 01 and Irgacure OXE 02 (all produced by Ciba Specialty Chemicals Co., Ltd.).

Additive

The photocurable resin layer may further contain an additive. Examples of the additive include the surfactants described in the paragraph [0017] of Japanese Patent No. 4,502,784 and the paragraphs [0060] to [0071] of JP-A-2009-237362, the thermal polymerization inhibitors described in the paragraph [0018] of Japanese Patent No. 4,502,784, and the additives described in the paragraphs [0058] to [0071] of JP-A-2000-310706.

Solvent

Examples of the solvent used for producing the photosensitive film of the invention by coating include the solvents described in the paragraphs [0043] to [0044] of JP-A-2011-95716.

The case where the photosensitive film of the invention is a negative type material has been mainly described above, but the photosensitive film may be a positive type material.

Viscosity of Photocurable Resin Layer

The viscosity of the photocurable resin layer measured at 100° C. preferably in a range of from 2,000 to 50,000 Pa·sec and preferably satisfies the following expression (A).

(viscosity of thermoplastic resin layer)<(viscosity of photocurable resin layer)  Expression (A):

The viscosities of the layers may be measured in the following manner. The solvent is removed from the thermoplastic resin layer or the photocurable resin layer by drying under atmospheric pressure and drying under reduced pressure to prepare a measurement specimen, which is measured under condition of a measurement start temperature of 50° C., a measurement end temperature of 150° C., a temperature raising rate of 5° C. per minute and a frequency of 1 Hz/deg, for example, with Rheovibron (model DD-III, produced by Baldwin Japan, Ltd.), and the measurement value at 100° C. is used.

Thermoplastic Resin Layer

The photosensitive film of the invention preferably has a thermoplastic resin layer provided between the provisional support and the colored photosensitive resin layer. The thermoplastic resin layer is preferably alkali-soluble. The thermoplastic resin layer may exhibit a function as a cushioning material for absorbing the unevenness on the surface of the underlayer (including the unevenness due to the image and the like having been formed thereon), and preferably has such a property that the layer is capable of being deformed corresponding to the unevenness on the target surface.

The thermoplastic resin layer preferably has an embodiment containing the polymer substance described in JP-A-5-72724 as a component, and particularly preferably has an embodiment containing at least one selected from organic polymer substances having a softening point of approximately 80° C. or less measured by a Vicart method (which may be specifically the polymer softening point measurement method according to ASTM D1235).

Specific examples thereof include a polyolefin, such as polyethylene and polypropylene, an ethylene copolymer of ethylene and vinyl acetate or a saponified product thereof or the like, a copolymer of ethylene and an acrylate ester or a saponified product thereof, polyvinyl chloride or a vinyl chloride copolymer of vinyl chloride and vinyl acetate or a saponified product thereof or the like, polyvinylidene chloride, a vinylidene chloride copolymer, polystyrene, a styrene copolymer of styrene and a (meth)acrylate ester or a saponified product thereof or the like, polyvinyltoluene, a vinyltoluene copolymer of vinyltoluene and a (meth)acrylate ester or a saponified product thereof or the like, a poly(meth)acrylate ester, a (meth)acrylate ester copolymer of butyl (meth)acrylate and vinyl acetate or the like, and a polyamide resin, such as a vinyl acetate copolymer nylon, a copolymer nylon, an N-alkoxymethylated nylon and an N-dimethylaminated nylon.

The thickness of the thermoplastic resin layer is preferably from 3 to 30 μm. When the thickness of the thermoplastic resin layer is less than 3 μm, the layer may have insufficient followability on lamination and thus may not absorb the unevenness on the surface of the underlayer completely. When the thickness of the layer exceeds 30 μm, the load on drying (removing the solvent) for forming the thermoplastic resin layer on the provisional support may be increased, the period of time for developing the thermoplastic resin layer may be increased, and the processability may be deteriorated. The thickness of the thermoplastic resin layer is more preferably from 4 to 25 μm, and particularly preferably from 5 to 20 μm.

The thermoplastic resin layer may be formed by coating or the like a preparation liquid containing the thermoplastic organic polymer, and the preparation liquid used on coating or the like may be prepared by using a solvent. The solvent is not particularly limited as far as it dissolves the polymer component constituting the layer, and examples thereof include methyl ethyl ketone, cyclohexanone, propylene glycol monomethyl ether acetate, n-propanol and 2-propanol.

The thermoplastic resin layer preferably has a viscosity measured at 100° C. in a range of from 1,000 to 10,000 Pa·sec.

Additional Layer

The photosensitive film used in the invention may be properly constituted by providing an intermediate layer between the photocurable resin layer and the thermoplastic resin layer, and a protective layer on the surface of the photocurable resin layer.

The photosensitive film used in the invention preferably has an intermediate layer for the purpose of preventing the components from being mixed on coating plural layers and on storage after coating plural layers. The intermediate layer is preferably an oxygen shielding film having an oxygen shielding function, which is described as the separating layer in JP-A-5-72724, and thus the sensitivity on exposure is enhanced to reduce the time load of the exposure machine, thereby enhancing the productivity.

Examples of the intermediate layer and the protective film include ones described in the paragraphs [0083] to [0087] and [0093] of JP-A-2006-259138, which may be appropriately used.

Method for Producing Photosensitive Film

The photosensitive film of the invention may be produced according to the production method of a photosensitive transfer material described in the paragraphs [0094] to [0098] of JP-A-2006-259138.

Specifically, in the case where the photosensitive film of the invention having an intermediate layer is produced, the photosensitive film may be favorably produced in such a manner that a solution containing a thermoplastic organic polymer and an additive dissolved therein (i.e., a coating liquid for a thermoplastic resin layer) is coated and dried on a provisional support to form a thermoplastic resin layer, then a preparation liquid, which is prepared by adding a resin and an additive to a solvent that does not dissolve the thermoplastic resin layer, (i.e., a coating liquid for an intermediate layer) is coated and dried on the thermoplastic resin layer to form an intermediate layer, and a coating liquid for a colored photosensitive resin layer, which is prepared by using a solvent that does not dissolve the intermediate layer, is further coated and dried on the intermediate layer to laminate a colored photosensitive layer.

Method for Producing Capacitance Type Input Device

The method for producing a capacitance type input device of the invention (which may be hereinafter referred to as the production method of the invention) is a production method of a capacitance type input device containing a front plate and on a non-contact surface thereof the following components (1) and (3) to (5), in which the decorative layer (1) is formed by transferring the colored layer of the photosensitive film of the invention to the non-contact surface of the front plate:

(1) a decorative layer, (3) plural first transparent electrode patterns that contain plural pad portions that are formed to extend in a first direction and connected through connecting portions, (4) plural second electrode patterns that are electrically insulated from the first transparent electrode patterns, and contain plural pad portions that are formed to extend in a direction intersecting the first direction, and (5) an insulating layer that electrically insulates the first transparent electrode patterns and the second electrode patterns from each other.

The capacitance type input device of the invention may further contain the following component (6):

(6) a conductive element that is other than the first transparent electrode patterns and the second electrode patterns and is electrically connected to at least one of the first transparent electrode patterns and the second electrode patterns.

In the capacitance type input device of the invention, the second electrode patterns may be transparent electrode patterns. While the second transparent electrode patterns may be described herein instead of the second electrode patterns, embodiments of the second electrode patterns may be the same as preferred embodiments of the second transparent electrode patterns.

In the method for producing a capacitance type input device of the invention, (2) a mask layer is preferably further provided on the surface of the decorative layer (1) on the non-contact surface side of the front plate that is opposite to the front plate.

Structure of Capacitance Type Input Device

The structure of the capacitance type input device produced by the production method of the invention will be described. FIG. 1 is a cross sectional view showing a preferred structure of the capacitance type input device of the invention. In FIG. 1, a capacitance type input device 10 is constituted by a front plate 1, a decorative layer 2a, a mask layer 2b, first transparent electrode patterns 3, second transparent electrode patterns 4, an insulating layer 5, a conductive element 6 and a transparent protective layer 7.

The front plate 1 is constituted by a translucent substrate, such as a glass substrate, and toughened glass, such as Gorilla Glass, available from Corning Inc., may be used. In FIG. 1, the surface of the front plate 1 where the components are provided is referred to as a non-contact surface. In the capacitance type input device 10 of the invention, input may be performed by touching the contact surface of the front plate 1 (which is the opposite surface to the non-contact surface) with a finger or the like. The front plate may be hereinafter referred to as a substrate in some cases.

The mask layer 2b is provided on the non-contact surface of the front plate 1. The mask layer 2b is in a flame pattern surrounding the display region formed on the non-contact surface of the front plate of the touch-sensitive panel, and is formed to hide laid circuits and the like.

The decorative layer 2a is formed for decoration on the mask layer 2b, i.e., between the non-contact surface of the front plate of the touch-sensitive panel and the mask layer 2b.

Figure 2:
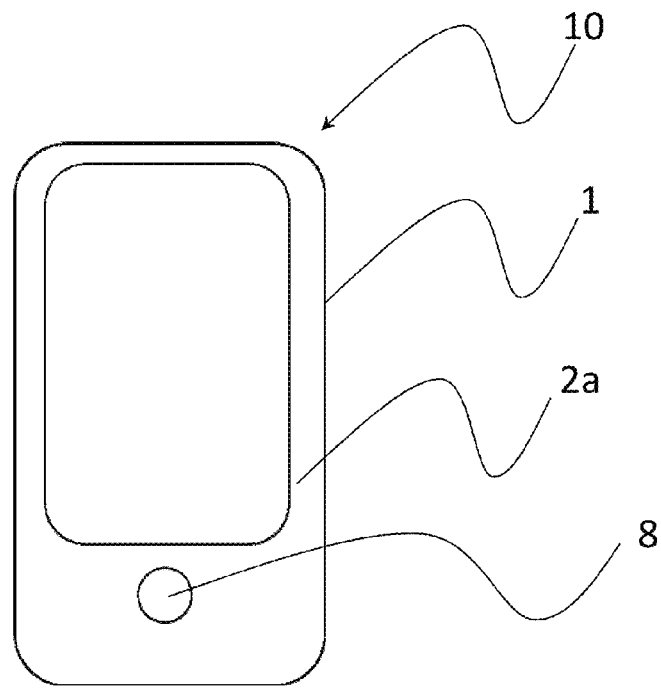
FIG. 2 is an illustrative view showing an example of a front plate in the invention.

In the capacitance type input device 10 of the invention, as shown in FIG. 2, the decorative layer 2a and the mask layer 2b are preferably formed to cover a partial region of the front plate 1 (which is the region other than the input surface in FIG. 2). Furthermore, the front plate 1 may have an opening 8 in a part of the front plate as shown in FIG. 2. A mechanical push switch may be provided in the opening 8. The toughened glass used as the substrate is difficult to be processed due to the high strength thereof, and it is the general procedure that the opening 8 is formed before the toughening treatment, and then the toughening treatment is performed. However, in the case where a white decorative layer or a transparent electrode pattern is to be formed on the substrate, which has been subjected to the toughening treatment, having the opening 8, with a liquid resist or a screen printing ink for forming a decorative layer, there is such a problem that the resist component may leak from the opening, and the resist component may leak from the edge of the glass and the mask layer, which necessarily forms a light-shielding pattern up to the edge of the front plate, thereby contaminating the back surface of the substrate. The problem may be solved in the case where the decorative layer 2a is formed on the substrate having the opening 8 by using the photosensitive film of the invention.

The front plate 1 has, formed on the non-contact surface thereof, plural first transparent electrode patterns 3 that contain plural pad portions that are formed to extend in a first direction and connected through connecting portions, plural second transparent electrode patterns 4 that are insulated from the first transparent electrode patterns 3 and contain plural pad portions that are formed to extend in a direction intersecting the first direction, and an insulating layer 5 that electrically insulates the first transparent electrode patterns 3 and the second electrode patterns 4 from each other. The first transparent electrode patterns 3, the second transparent electrode patterns 4 and a conductive element 6 described later may be produced with a transparent conductive metal oxide film, such as ITO (indium tin oxide) and IZO (indium zinc oxide). Examples of the metal film include an ITO film; a metal film, such as Al, Zn, Cu, Fe, Ni, Cr and Mo; and a metal oxide film, such as $SiO_2$. In this case, the thickness of the components may be from 10 to 200 nm. An amorphous ITO film may be converted to a polycrystalline ITO film by baking, thereby reducing the electric resistance. The first transparent electrode patterns 3, the second transparent electrode patterns 4 and a conductive element 6 described later may also be produced with a photosensitive film having a photocurable resin layer containing conductive fibers described later. In the case where the first transparent electrode patterns and the like are formed with ITO or the like, reference may be made to the paragraphs [0014] to [0016] of Japanese Patent No. 4,506,785.

At least one of the first transparent electrode patterns 3 and the second transparent electrode patterns 4 may be provided over both regions in the non-contact surface of the front plate 1 and the surface of the mask layer 2a that is opposite to the front plate 1. FIG. 1 shows an illustration, in which the second transparent electrode patterns are provided over both regions in the non-contact surface of the front plate 1 and the surface of the mask layer 2a that is opposite to the front plate 1. In the case where the photosensitive film is laminated over the mask layer, which necessarily has a certain thickness, and the back surface of the front plate, as in this case, the photosensitive film of the invention having the particular layer structure may be laminated without occurrence of bubbles at the boundary of the mask by a simple process step without the use of an expensive equipment, such as a vacuum laminator.

Figure 3:
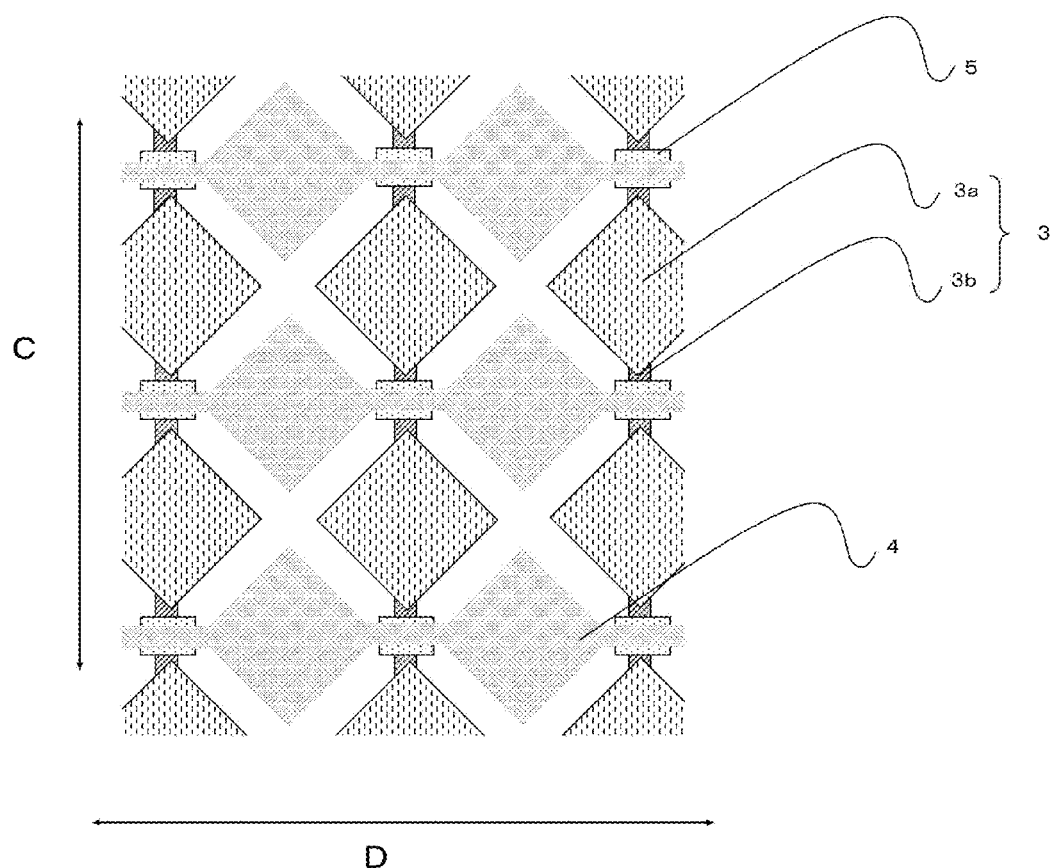
FIG. 3 is an illustrative view showing an example of first transparent electrode patterns and second transparent electrode patterns in the invention.

The first transparent electrode patterns 3 and the second transparent electrode patterns 4 will be described with reference to FIG. 3. FIG. 3 is an illustrative view showing an example of the first transparent electrode patterns and the second transparent electrode patterns in the invention. As shown in FIG. 3, the first transparent electrode patterns 3 contain pad portions 3a that are formed to extend in a first direction and connected through connecting portions 3b. The second transparent electrode patterns 4 are electrically insulated from the first transparent electrode patterns 3 with an insulating layer 5, and contain plural pad portions that are formed to extend in a direction intersecting the first direction (i.e., a second direction in FIG. 3). In the formation of the first transparent electrode patterns 3, the pad portions 3a and the connecting portions 3b may be produced integrally with each other, or may be produced in such a manner that only the connecting portions 3b are produced, and then the pad portions 3a and the second transparent electrode patterns 4 are produced (patterned) integrally with each other. In the case where the pad portions 3a and the second transparent electrode patterns 4 are produced (patterned) integrally with each other, the layers are formed to make such a structure as shown in FIG. 3 that a part of the connecting portions 3b and a part of the pad portions 3a are connected to each other, and the first transparent electrode patterns 3 and the second transparent electrode patterns 4 are electrically insulated from each other with the insulating layer 5.

In FIG. 1, a conductive element 6 is provided on the surface of the mask layer 2a that is opposite to the front plate 1. The conductive element 6 is electrically connected to at least one of the first transparent electrode patterns 3 and the second electrode patterns 4, and is an element that is other than the first transparent electrode patterns 3 and the second electrode patterns 4. FIG. 1 shows an illustration, in which the conductive element 6 is connected to the second transparent electrode patterns 4.

As shown in FIG. 1, a transparent protective layer 7 is provided to cover the entire of the constitutional components. The transparent protective layer 7 may be constituted to cover apart of the constitutional components. The insulating layer 5 and the transparent protective layer 7 may be formed of the same material or different materials. The material constituting the insulating layer 5 and the transparent protective layer 7 preferably has a high surface hardness and a high heat resistance, and examples thereof used include a known photosensitive siloxane resin material and a known acrylic resin material.

The layers in the production method of the invention will be described in detail below.

Figure 4:
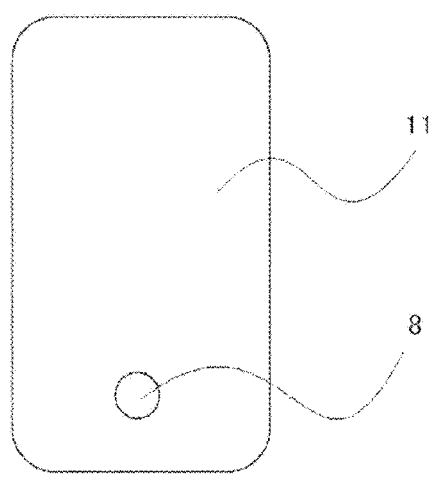
FIG. 4 is a top view showing an example of toughened glass having an opening therein.
Figure 5:
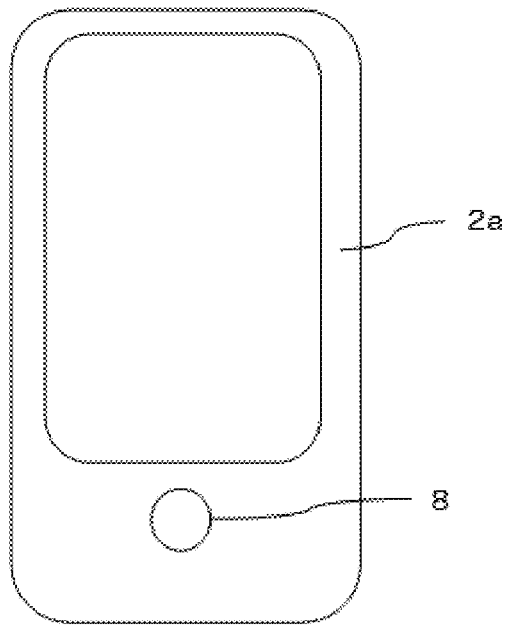
FIG. 5 is a top view showing an example of a front plate having a decorative layer and a mask layer formed thereon.
Figure 6:
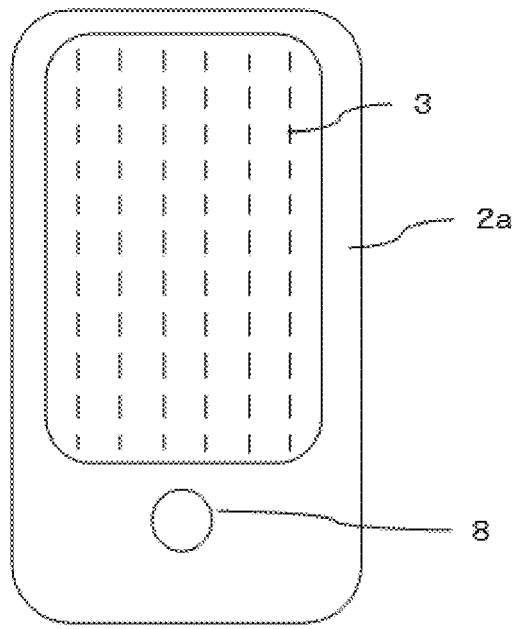
FIG. 6 is a top view showing an example of a front plate having first transparent electrode patterns formed thereon.
Figure 7:
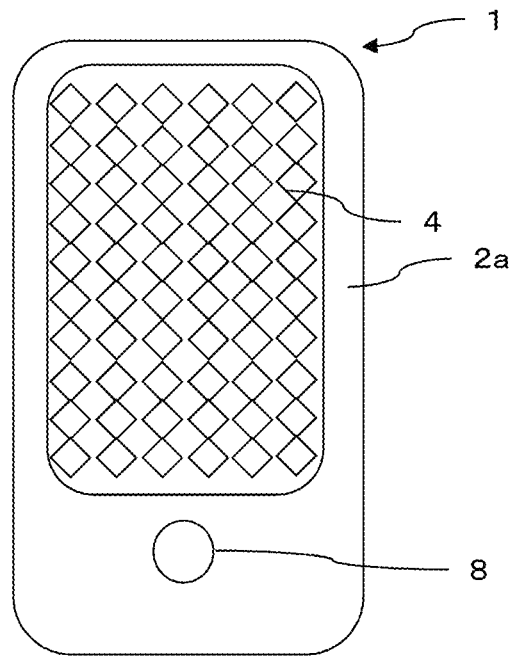
FIG. 7 is a top view showing an example of a front plate having first and second transparent electrode patterns formed thereon.
Figure 8:
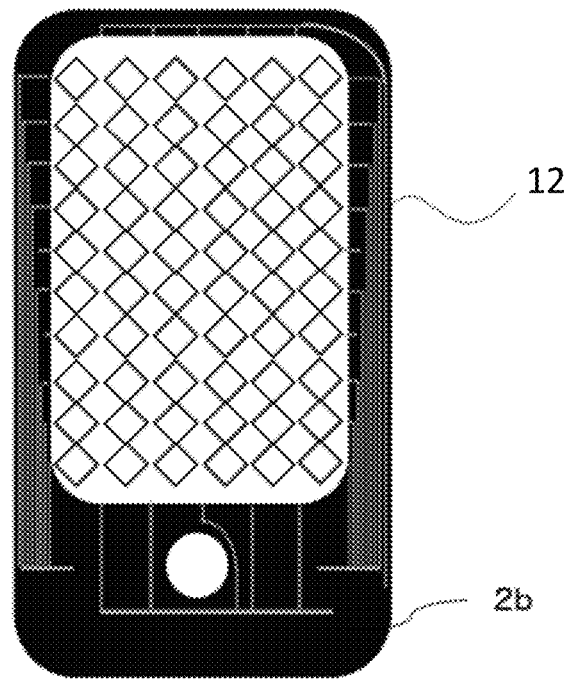
FIG. 8 is a top view showing an example of a front plate having a conductive element that is other than first transparent electrode patterns and second electrode patterns.

Examples of the embodiments formed in the course of the production method of the invention include the embodiments shown in FIGS. 4 to 8. FIG. 4 is a top view showing an example of toughened glass 11 having an opening 8 therein. FIG. 5 is a top view showing an example of a front plate having a decorative layer 2a and a mask layer 2b formed thereon. FIG. 6 is a top view showing an example of a front plate having first transparent electrode patterns 3 formed thereon. FIG. 7 is a top view showing an example of a front plate having first transparent electrode patterns 3 and second transparent electrode patterns 4 formed thereon. FIG. 8 is a top view showing an example of a front plate having a conductive element 6 that is other than first transparent electrode patterns and second electrode patterns. FIGS. 6 to 8 are conceptual illustrations for showing the configuration of the first transparent electrode patterns 3, the second transparent electrode patterns 4 and the conductive element 6 present inside the front plate viewed from the side of the decorative layer 2a of the front plate, and these elements inside may not be viewed from the side of the decorative layer 2a due to the presence of the decorative layer 2a. In FIGS. 6 to 8, a mask layer 2b may be or may not be present. These are examples embodying the aforementioned description, and the scope of the invention is not construed as being limited by the drawings.

(1) Decorative Layer

The production method of the invention contains at least forming the decorative layer (1) by using the photosensitive film of the invention.

In the case where the decorative layer 2a and the like are formed by using the photosensitive film, even though the substrate (front plate) has an opening, leakage of a resist component from the opening may be prevented from occurring, and protrusion of a resist component may be prevented from occurring from the edge of the glass at the mask layer, which necessarily forms a light-shielding pattern up to the edge of the front plate. Accordingly, the back surface of the substrate may be prevented from being contaminated, and a touch-sensitive panel that is advantageously reduced in thickness and weight may be produced by a convenient process.

The method for forming the decorative layer by using the photosensitive film of the invention in the case of using a transfer film may be an ordinary lithography method when the colored layer contains a photocurable resin. The photosensitive film having been laminated on the substrate is exposed in the form of the target pattern, and then developed for removing the non-exposed regions in the case of the negative type material or the exposed regions in the case of the positive type material, thereby providing the pattern. In the development in this case, the thermoplastic resin layer and the photocurable layer may be removed by development with different liquids or may be removed with the different liquid. The decorative layer may be formed with the transfer film of the invention by a half cut transfer method or a die cut transfer method described below.

Figure 10:
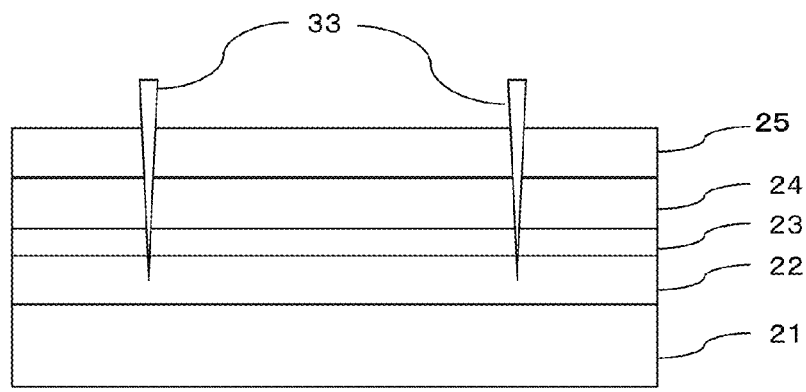
FIG. 10 is an illustrative view showing a half cut method.
Figure 11:
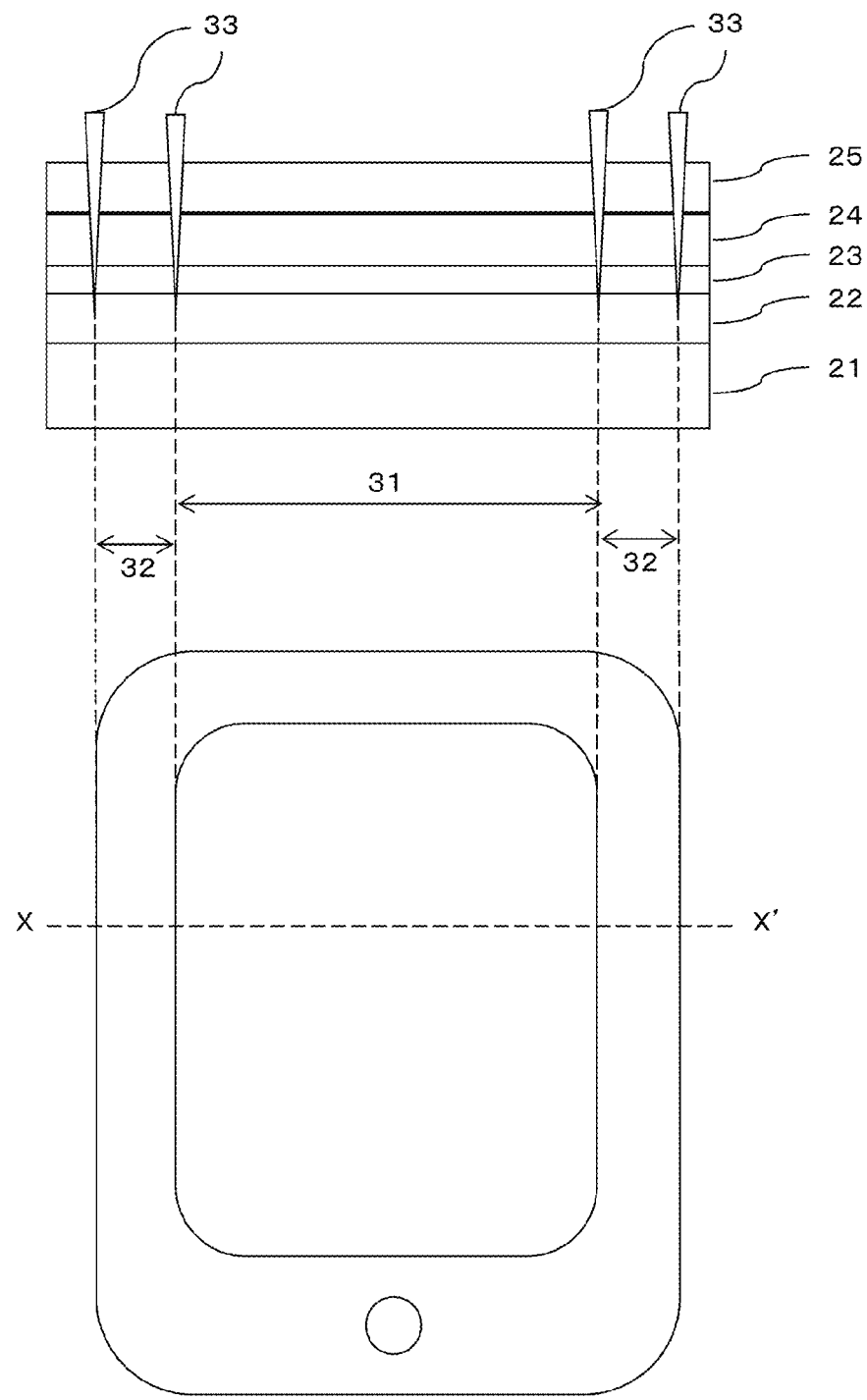
FIG. 11 is an illustrative view showing a half cut method of a transfer film used for forming a decorative layer in an X-X' cross section of a front plate.
Figure 12:
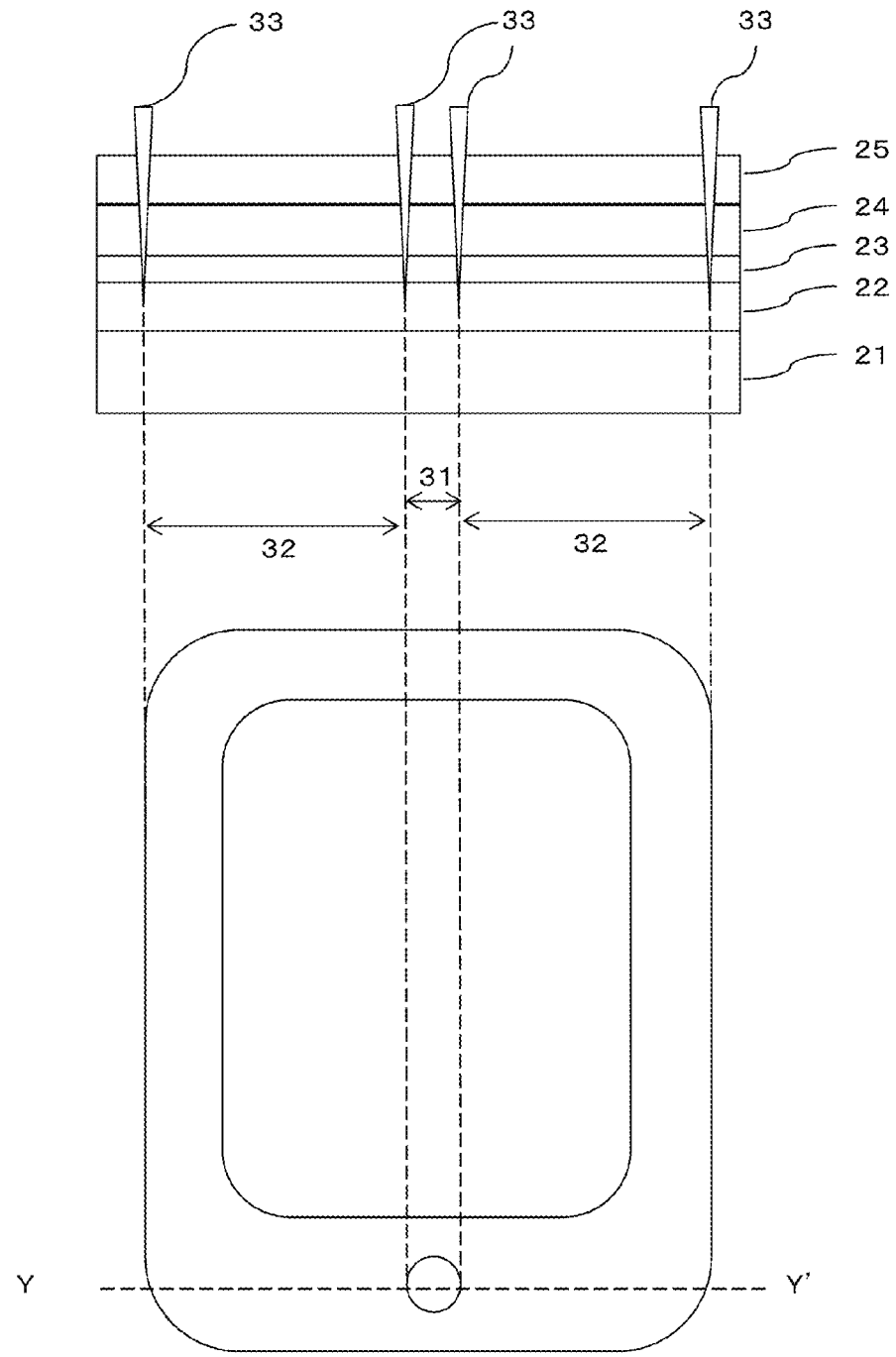
FIG. 12 is an illustrative view showing a half cut method of a transfer film used for forming a decorative layer in an Y-Y' cross section of a front plate.

In the half cut transfer method, as shown in FIGS. 10 to 12, the film is preliminarily cut at the boundary between the image region 32 and the non-image region 31 of the decorative layer with a razor blade, then the protective film, the decorative layer and the intermediate layer in the non-image region 31 are removed with an adhesive tape, the protective film in the image region 32 is further removed, and the decorative layer pattern is transferred to the substrate.

Figure 13:
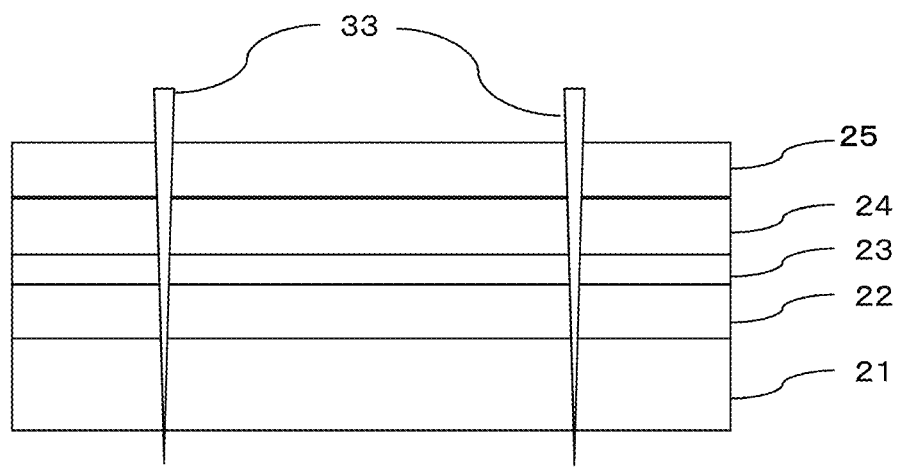
FIG. 13 is an illustrative view showing a die cut method.
Figure 14:
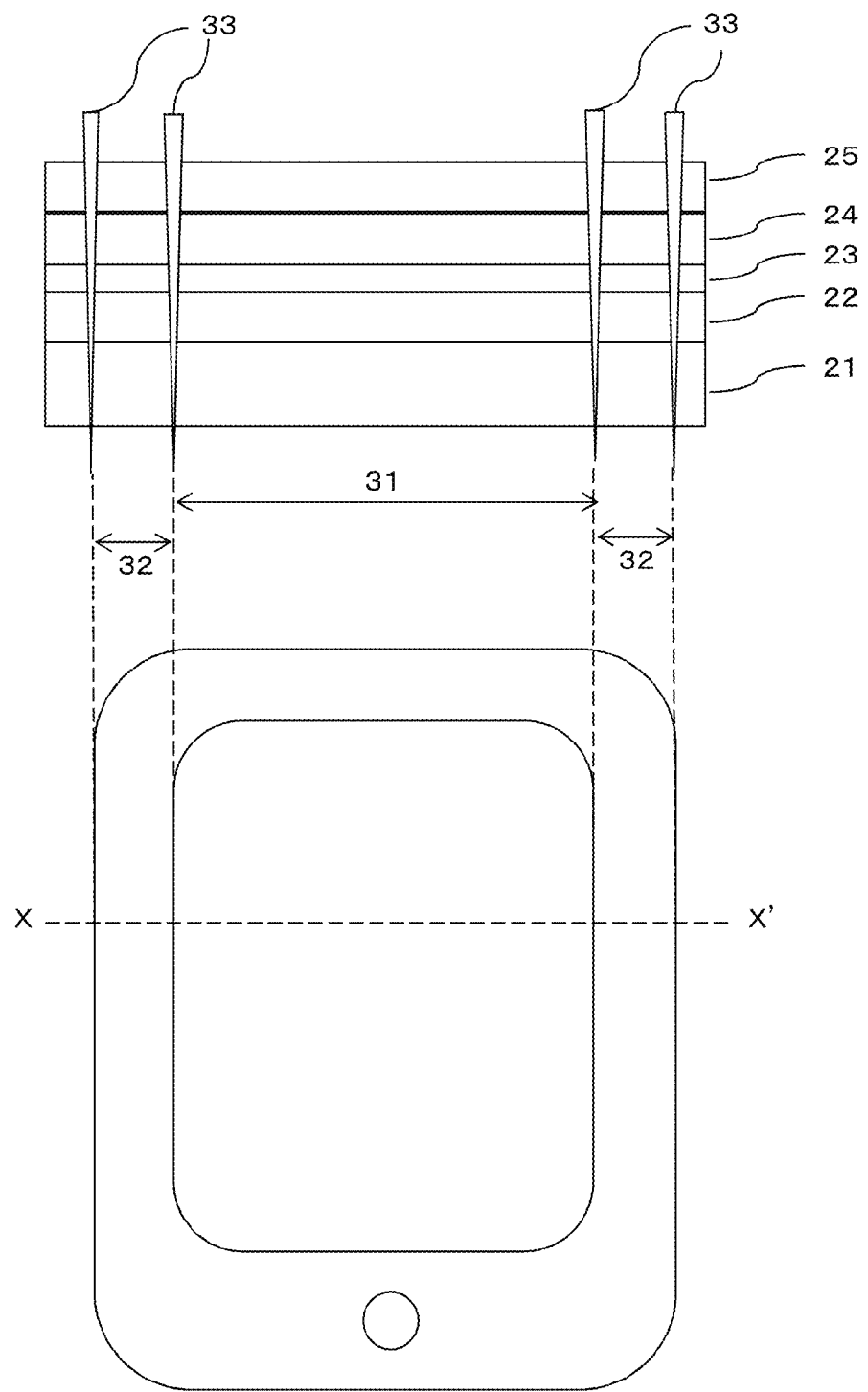
FIG. 14 is an illustrative view showing a die cut method of a transfer film used for forming a decorative layer in an X-X' cross section of a front plate.
Figure 15:
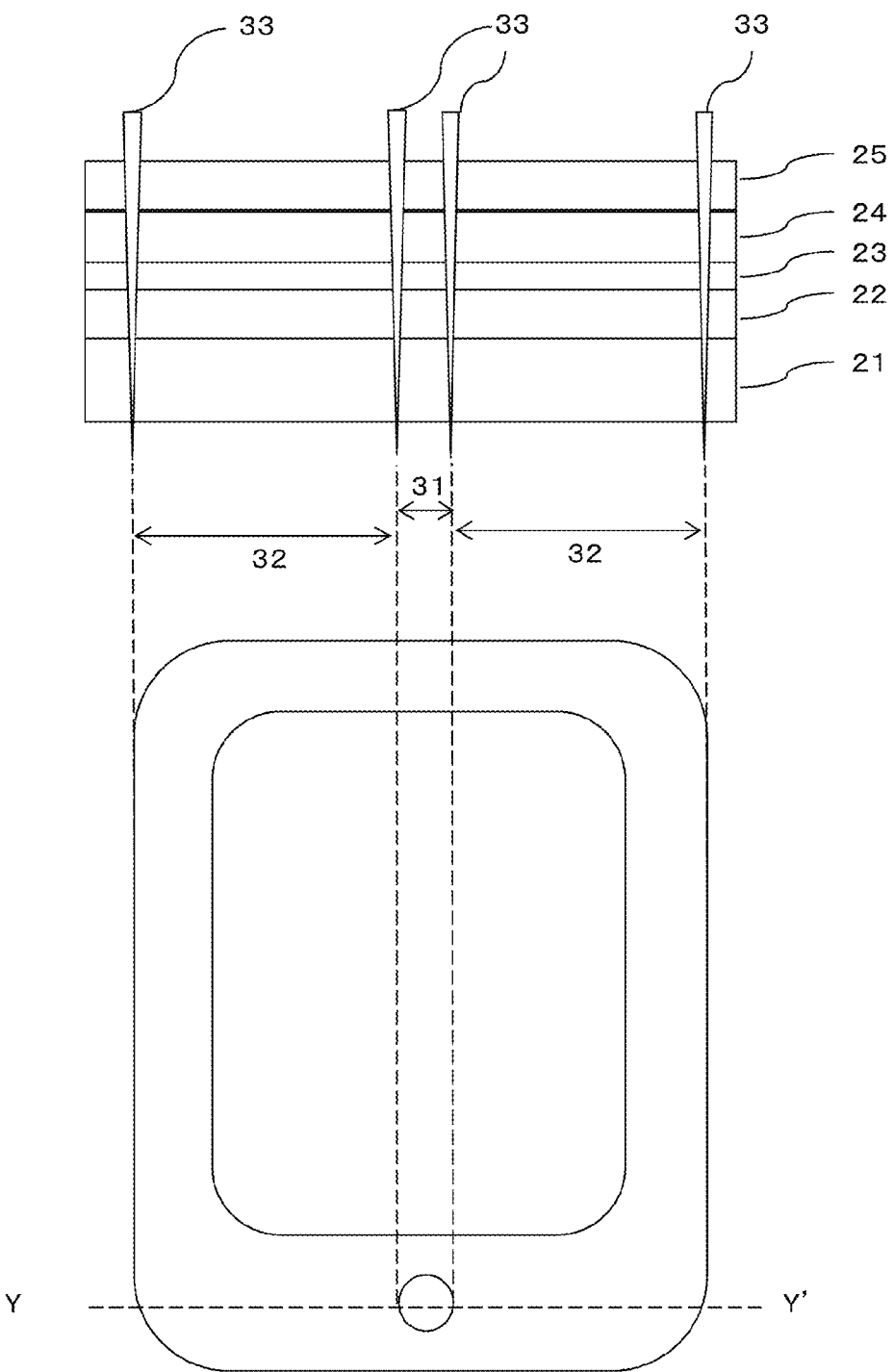
FIG. 15 is an illustrative view showing a die cut method of a transfer film used for forming a decorative layer in an Y-Y' cross section of a front plate.

In the die cut transfer method, as shown in FIGS. 13 to 15, the film is preliminarily cut at the boundary between the image region 32 and the non-image region 31 of the decorative layer with a razor blade through all the layers, then the colored layer in the partial region (non-image region 31) is removed, then the protective film in the remaining image region 32 is removed with an adhesive tape, and the decorative layer pattern is transferred to the substrate.

Subsequently, the thermoplastic resin layer and the intermediate layer are removed by development, thereby forming the decorative layer pattern.

A known developing equipment, such as a brush or a high-pressure jet, may be used in combination depending on necessity. After the development, post exposure and post baking may be performed.

For enhancing the adhesiveness of the photosensitive resin layer by lamination in the later transferring step, the non-contact surface of the substrate (front plate) may be subjected to a surface treatment in advance. The surface treatment performed is preferably a surface treatment using a silane compound (i.e., a silane coupling treatment). The silane coupling agent used preferably has a functional group that undergoes mutual action with the photosensitive resin. For example, a silane coupling solution (a 0.3% by mass aqueous solution of N-β-(aminoethyl)-γ-aminopropyltrimethoxysilane, KBM603, a trade name, produced by Shin-Etsu Chemical Co., Ltd.) is sprayed to the surface by showering for 20 seconds, and then the surface is rinsed with pure water. Thereafter, the silane coupling agent is reacted by heating. A heating chamber may be used, and the reaction may be accelerated by preliminary heating for the substrate with a laminator.

As for the case where a permanent material is formed with the photosensitive film of the invention, the patterning method using the photosensitive film of the invention will be described for the case of forming a decorative layer as an example.

Examples of the method for forming the decorative layer include a method containing a cover film removing step of removing the cover film from the photosensitive film of the invention, a transferring step of transferring the photosensitive resin layer of the photosensitive transfer material, from which the cover film has been removed, to the substrate, an exposing step of exposing the photosensitive resin layer having been transferred to the substrate, and the developing step of developing the photosensitive resin layer having been exposed, thereby providing a pattern image.

In the case where an image is formed by an ordinary photolithography method, examples of the method include a method containing a cover film removing step of removing the cover film from the photosensitive film of the invention, and a transferring step of transferring the photosensitive resin layer of the photosensitive transfer material, from which the cover film has been removed, to the substrate.

The method for forming the decorative layer preferably contains a half cut step, i.e., a step of cutting a part of the transfer film through the colored layer but not through the provisional support, a step of removing the colored layer in at least a part of the region in the region surrounded by the cut, and a step of forming the decorative layer (1) by using the transfer film, from which the colored layer in the part of the region has been removed.

The method for forming the decorative layer also preferably contains a die cut step, i.e., a step of cutting a part of the transfer film through the colored layer to the provisional support, and a step of forming the decorative layer (1) by using the transfer film, from which the colored layer in the part of the region has been removed.

The step of cutting a part of the transfer film through the colored layer but not through the provisional support and the step of cutting a part of the transfer film through the colored layer to the provisional support are referred to as a preliminarily cutting step of the image region to be transferred in the colored layer. The procedure of cutting through the colored layer but not through the provisional support is referred to as a half cut step. The procedure of cutting through the colored layer to the provisional support is referred to as a die cut step.

The step of removing the colored layer in at least a partial region in the region surrounded by the cut may be referred to as a step of removing the colored layer in the non-transferred non-image region.

In the case where the transfer film of the invention contains the protective film, the intermediate layer and the thermoplastic resin layer, the step of removing the colored layer in at least a partial region in the region surrounded by the cut is preferably a step of removing the protective layer and the colored layer in the non-image region and the protective film in the image region.

The step of forming the decorative layer (1) by using the transfer film, from which the colored layer in the partial region is removed, may be referred to as a step of transferring the colored layer in the image region to the substrate.

In the case where the transfer film of the invention contains the protective film, the intermediate layer and the thermoplastic resin layer, the step of forming the decorative layer (1) by using the transfer film, from which the colored layer in the partial region is removed, is preferably a transferring step of transferring the colored layer in the image region of the transfer film, from which the protective film is removed, to the substrate.

In this case, the step of forming the decorative layer (1) by using the transfer film, from which the colored layer in the partial region is removed, preferably contains a step of releasing the provisional support having been transferred to the substrate.

In this case, the step of forming the decorative layer (1) by using the transfer film, from which the colored layer in the partial region is removed, preferably contains a step of removing the thermoplastic resin layer and the intermediate layer.

The production method of the invention preferably contains a step of preliminarily cutting the colored layer of the transfer film in an image region to be transferred, a step of removing the protective film and the colored film in the non-image region and the protective film in an image region, a transferring step of transferring the colored layer in the image region of the transfer film to a substrate, a step of releasing the provisional support having been transferred to the substrate, and a step of removing the thermoplastic resin layer and the intermediate layer.

In the case where the colored layer has the photocurable resin layer, examples of the method for forming the decorative layer include a method containing a protective film removing step of removing the protective film from the transfer film, a transferring step of transferring the photocurable resin layer of the photosensitive transfer material, from which the protective film has been removed, to a substrate. In this case, the method preferably further contains after the transferring step a step of post-exposing the photocurable resin layer having been transferred.

Preliminarily Cutting Step

In the case where the image formation is not performed by an ordinary photolithography process in the production method of the invention, an image region is necessarily formed in the colored layer before transferring.

Examples of the kind of the preliminarily cutting step include a step of cutting a part of the transfer film through the colored layer but not through the provisional support (i.e., a half cut step) and a step of cutting a part of the transfer film through the colored layer to the provisional support (i.e., the die cut step).

(i) Half Cut Step

The half cut step will be described below.

The method of cutting is not particularly limited, and the film may be cut with an arbitrary measure, such as a blade and laser, and preferably cut with a blade. The structure of the blade is not particularly limited.

In the case where the transfer film has the provisional support, the thermoplastic resin layer, the intermediate layer, the colored layer and the protective film, which are laminated in this order, for example, the transfer film may be cut, for example, with a blade or laser from the side of the protective film through the protective film, the colored layer, the intermediate layer and apart of the thermoplastic resin layer, and thereby the image region to be transferred and the non-image region not to be transferred may be separated from each other.

Step of Removing Colored Layer in Non-Image Region

For selectively transferring the image region of the colored layer having been preliminarily cut by the half cut step to the substrate, it is necessary to prevent the non-image region from being transferred. One of the measures therefor is a method of removing the colored layer in the non-image region, in which after removing the protective film, the colored layer and the intermediate layer in the non-image region are simultaneously released. Another one of the measures therefor is a method of releasing the protective film in the non-image region, subsequently releasing the colored layer and the intermediate layer therein simultaneously, and further removing the protective film in the image region. The later method is preferred from the standpoint of protecting the colored layer in the image region until immediately before transferring.

(ii) Die Cut Step

The step of cutting a part of the transfer film of the invention through the colored layer to the provisional support (i.e., the die cut step) will be described below.

The method of cutting is not particularly limited as similar to the half cut step, and the film may be cut with an arbitrary measure, such as a blade and laser, and preferably cut with a blade. The structure of the blade is not particularly limited.

In the case where the transfer film has the provisional support, the thermoplastic resin layer, the intermediate layer, the colored layer and the protective film, which are laminated in this order, for example, the transfer film may be cut, for example, with a blade or laser from the side of the protective film through the protective film, the colored layer, the intermediate layer, the thermoplastic resin layer and the provisional support, and thereby the image region to be transferred and the non-image region not to be transferred may be separated from each other.

Transferring Step

The transferring step is a step of transferring the photocurable resin layer of the photosensitive film, from which the cover film has been removed, to the substrate.

In this case, such a method is preferred that the photocurable resin layer of the photosensitive film is laminated to the substrate, and then the provisional support is removed.

The photocurable resin layer may be transferred (adhered) to the surface of the substrate by superimposing the photocurable resin layer to the surface of the substrate, to which pressure and heat are applied. The adhesion may be performed with a known laminator, such as a laminator, a vacuum laminator, and an automatic cutting laminator capable of enhancing the productivity.

Step of Exposing Photosensitive Resin Composition on Substrate

In the case where an image is formed by an ordinary photolithography process, where the decorative layer is applied to the substrate by using the photosensitive film, the exposing step is preferably a step of exposing the photocurable resin layer having been transferred to the substrate.

Specific examples of the method include a method of disposing a prescribed mask on the photocurable resin layer formed on the substrate, and then exposing the photocurable resin layer from above the mask through the mask, the thermoplastic resin layer and the intermediate layer.

For the light source for exposure, ones capable of radiating light having a wavelength range capable of curing the photocurable resin layer (for example, 360 nm, 405 nm or the like) may be appropriately selected and used. Specific examples thereof include a super-high pressure mercury lamp, a high pressure mercury lamp and a metal halide lamp. The exposure amount is generally approximately from 5 to 200 mJ/cm$^2$, and preferably approximately from 10 to 100 mJ/cm$^2$.

Developing Step

In the case where an image is formed by an ordinary photolithography process, the development may be performed by using a developer liquid. The developer liquid is not particularly limited, and known developer liquids described, for example, in JP-A-5-72724 may be used. The developer liquid preferably induces a dissolution type development behavior of the photocurable resin layer, and preferably contains a compound having pKa of from 7 to 13 in a concentration of from 0.05 to 5 mol/L, but a small amount of an organic solvent that is miscible with water may be added thereto. Examples of the organic solvent that is miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam and N-methylpyrrolidone. The concentration of the organic solvent is preferably from 0.1 to 30% by mass.

The developer liquid may contain a known surfactant. The concentration of the surfactant is preferably from 0.01 to 10% by mass.

The developing method may be any of paddle developing, shower developing, shower and spin developing, and dip developing. The shower developing will be described. The developer liquid may be sprayed by showering onto the photocurable resin layer after exposing, thereby removing the uncured portion.

In the case where the thermoplastic resin layer and the intermediate layer are provided, the thermoplastic resin layer, the intermediate layer and the like are preferably removed before developing, in such a manner that an alkaline liquid that has low solubility to the photocurable resin layer is sprayed by showering thereto. After developing, the development residue is preferably removed by spraying a rinsing liquid by showering while rubbing with a brush or the like. The developer liquid preferably has a temperature of from 20 to 40° C. and pH of from 8 to 13.

In the case where the colored layer having been preliminarily cut by the half cut step or the die cut step is transferred to the substrate, and a prescribed pattern is formed therein, the exposing step and the developing step in the ordinary photolithography process may not be contained. In this case when the thermoplastic resin layer and the intermediate layer are provided, a step of removing the thermoplastic resin layer and the intermediate layer may be contained after the transferring step, and the step of removing the thermoplastic resin layer and the intermediate layer may be performed by using the same one as the alkali developer liquid used in the ordinary lithography process.

Post-Exposing Step

The post-exposing step may be contained after the developing step.

The post-exposing step may be performed only from the surface of the photocurable resin composition that is in contact with the substrate, only from the surface thereof that is not in contact with the substrate, or from both the surfaces thereof.

Additional Steps

The production method of the invention may have additional steps, such as a post-baking step.

For the exposing step, the developing step and the additional steps, the methods described in the paragraphs [0035] to [0051] of JP-A-2006-23696 may also be preferably applied to the invention.

The patterning exposure may be performed after releasing the provisional support, or may be performed before releasing the provisional support, and then the provisional support is released. The exposure may be performed by using a mask or may be digital exposure using laser or the like.

(2) Mask Layer

In the production method of the invention, in addition to the decorative layer 2a, at least one element of the mask layer 2b, the first transparent electrode patterns 3, the second transparent electrode patterns 4, the insulating layer 5, the conductive element 6, and depending on necessity the transparent protective layer 7 is preferably formed by using the photosensitive film having the provisional support having laminated thereon the photosensitive resin layer, and is more preferably formed by using the photosensitive film having the provisional support, the thermoplastic resin layer and the photocurable resin layer in this order.

For example, in the case where a black mask layer 2 is formed, the photosensitive film having a black photocurable resin layer as the photocurable resin layer may be used, and the black photocurable resin layer may be transferred to the surface of the front plate 1.

Furthermore, the use of the photosensitive film having the particular layer structure that has the thermoplastic resin layer between the photocurable resin layer and the provisional support for forming the mask layer 2b required to have light shielding property may prevent formation of bubbles on laminating the photosensitive film, thereby forming the mask layer 2b and the like having high quality without leakage of light.

In the case where the photocurable resin layer of the photosensitive film is used as the mask layer, a colorant may be used in the photocurable resin layer. The colorant used in the invention is preferably a known colorant (such as an organic pigment, an inorganic pigment, a dye and the like). In the invention, mixtures of white, black, red, blue, green and the like pigments may be used.

In the case where the photocurable resin layer of the photosensitive film is used as a black mask layer, a black colorant is preferably used from the standpoint of the optical density. Examples of the black colorant include carbon black, titanium carbide, iron oxide, titanium oxide and graphite, and among these carbon black is preferred.

For using as a mask layer of other colors, the pigments and dyes described in the paragraphs [0183] to [0185] of Japanese Patent No. 4,546,276 may be mixed and used. Specifically, the pigments and dyes described in the paragraphs [0038] to [0054] of JP-A-2005-17716, the pigments described in the paragraphs [0068] to [0072] of JP-A-2004-361447, the colorants described in the paragraphs [0080] to [0088] of JP-A-2005-17521 and the like may be preferably used.

The colorant that is used in the invention except for the decorative layer preferably has a number average particle diameter of from 0.001 to 0.1 µm, and more preferably from 0.01 to 0.08 µm, from the standpoint of the dispersion stability. The term "particle diameter" herein means the diameter of the circle that has the same area as that of the electron micrograph, and the term "number average particle diameter" means such a value that the particle diameter is measured for many particles, and the average value of 100 particles is designated as the number average particle diameter.

(3) Plural First Transparent Electrode Patterns that Contain Plural Pad Portions that are Formed to Extend in First Direction and Connected Through Connecting Portions In the method for producing a capacitance type input device of the invention, at least one of the first transparent electrode patterns, the second transparent electrode patterns and the conductive element is preferably formed by an etching treatment of a transparent conductive material by using an etching pattern, which is formed with a photosensitive film having a provisional support, a thermoplastic resin layer and a photocurable resin layer in this order.

In the method for producing a capacitance type input device of the invention, at least one of the first transparent electrode patterns, the second transparent electrode patterns and the conductive element is preferably formed by using a photosensitive film having a provisional support, a thermoplastic resin layer and a conductive photocurable resin layer in this order. The production of at least one of the first transparent electrode patterns, the second transparent electrode patterns and the conductive element by using a photosensitive film having a provisional support and a conductive curable resin layer in this order specifically means that at least one of the first transparent electrode patterns, the second transparent electrode patterns and the conductive element is formed by transferring the conductive curable resin film layer of the photosensitive film having the provisional support and the conductive curable resin layer in this order.

Accordingly, the first transparent electrode patterns 3 are preferably formed by an etching treatment or by using a photosensitive film having a conductive photocurable resin layer.

Etching Treatment

In the case where the first transparent electrode patterns 3 are formed by an etching treatment, a transparent electrode layer, such as ITO, is formed by sputtering on the non-contact surface of the front plate 1 having the mask layer 2 and the like formed thereon. Subsequently, an etching pattern is formed on the transparent electrode layer through exposure and development of the photosensitive film having a photocurable resin layer for etching as the photocurable resin layer. Thereafter, the transparent electrode layer is etched to pattern the transparent electrode, and then the etching pattern is removed, thereby forming the first transparent electrode patterns 3 and the like.

In the case where the photosensitive film of the invention is used as an etching resist (i.e., the etching pattern), the resist pattern may be obtained in the similar manner as above. In the etching treatment, etching and removal of the resist may be performed by a known method described in the paragraphs [0048] to [0054] of JP-A-2010-152155 and the like.

Examples of the etching method include a wet etching method by immersing in an etching liquid, which is ordinarily performed. The etching liquid used in the wet etching method may be selected from an acidic type and an alkaline type depending on the target of etching. Examples of the acidic type etching liquid include an aqueous solution containing a sole acidic component, such as hydrochloric acid, sulfuric acid, hydrofluoric acid or phosphoric acid, and a mixed aqueous solution of the acidic component and a salt, such as ferric chloride, ammonium fluoride or potassium permanganate. The acidic component may be a mixture of plural acidic components. Examples of the alkaline type etching liquid include an aqueous solution containing a sole alkaline component, such as sodium hydroxide, potassium hydroxide, ammonia, an organic amine or tetramethylammonium hydroxide, and a mixed aqueous solution of the alkaline component and a salt, such as potassium permanganate. The alkaline component may be a mixture of plural alkaline components.

The temperature of the etching liquid is not particularly limited and is preferably 45° C. or less. The resin pattern used as an etching mask (etching pattern) in the invention is formed by using the photocurable resin layer described above, and thereby exhibits excellent resistance to the acidic or alkaline etching liquid in the temperature range. Accordingly, the resin pattern is prevented from being released during the etching process, and thereby the portion having no resin pattern thereon is selectively etched.

After etching, a rinsing step and a drying step may be performed depending on necessity for preventing line contamination from occurring. For example, the rinsing step may be performed by rinsing the substrate with pure water at ordinary temperature for from 10 to 300 seconds, and the drying step may be performed by blowing air thereto at an air blowing pressure that is appropriately controlled (approximately from 0.1 to 5 kg/cm$^2$).

The subsequent method of releasing the resin pattern is not particularly limited, and examples thereof include a method of dipping the substrate in a releasing liquid at from 30 to 80° C., and preferably from 50 to 80° C., under stirring for from 5 to 30 minutes. The resin pattern used as the etching mask in the invention exhibits excellent chemical resistance at 45° C. or less as described above, but exhibits swelling property with an alkaline releasing liquid at a temperature of 50° C. or more. According to the property, the releasing step performed with a releasing liquid at from 50 to 80° C. provides such advantages that the period of time for the releasing step may be shortened, and the residue of the resin pattern after releasing may be reduced. Accordingly, by providing a difference in temperature between the liquids in the etching step and the releasing step, the resin pattern used as the etching mask in the invention exhibits good chemical resistance in the etching step, whereas exhibits good releasing property in the releasing step, and thus the resin pattern satisfies both the chemical resistance and the releasing property, which are contradictory to each other.

Examples of the releasing liquid include solutions obtained by dissolving an inorganic alkaline component, such as sodium hydroxide and potassium hydroxide, or an organic alkaline component, such as a tertiary amine and a quaternary ammonium salt, in water, dimethylsulfoxide, N-methylpyrrolidone, or a mixed solvent thereof. The releasing step may also be performed by a spraying method, a shower method, a paddle method or the like by using the releasing liquid.

Method of Using Photosensitive Film Having Conductive Photocurable Resin Layer

The first transparent electrode patterns, the second transparent electrode patterns and other conductive members may also be formed by using the photosensitive film of the invention as a lift-off material. In this case, after patterning by using the photosensitive film of the invention, a transparent conductive layer is formed on the entire surface of the substrate, and then the photocurable resin layer of the invention is removed along with the transparent conductive layer accumulated thereon, thereby providing the target transparent electrode patterns (i.e., a lift-off method).

In the case where the first transparent electrode patterns 3 are formed by using the photosensitive film having the conductive photocurable resin layer, the electrode patterns may be formed by transferring the conductive photocurable resin layer to the surface of the front plat 1.

By forming the first transparent electrode patterns 3 by using the photosensitive film having the conductive photocurable resin layer, leakage of a resist component from an opening even using the substrate (front plate) having the opening may be prevented from occurring, whereby the back surface of the substrate may be prevented from being contaminated, and a touch-sensitive panel that is advantageously reduced in thickness and weight may be produced by a convenient process.

Furthermore, the use of the photosensitive film of the invention having the particular layer structure that has the thermoplastic resin layer between the conductive photocurable resin layer and the provisional support for forming the first transparent electrode patterns 3 may prevent formation of bubbles on laminating the photosensitive film, thereby forming the first transparent electrode patterns 3 that are excellent in conductivity with a low resistance.

In the case where the photosensitive film has the conductive photocurable resin layer, the photocurable resin layer may contain conductive fibers or the like.

Conductive Photocurable Resin Layer (Conductive Fibers)

In the case where the photosensitive film having the conductive photocurable resin layer laminated thereon is used for forming the transparent electrode patterns or the conductive element, conductive fibers shown below or the like may be used in the photocurable resin layer.

The structure of the conductive fibers is not particularly limited and may be appropriately selected depending on the purpose, and any one of a solid structure and a hollow structure is preferred.

Fibers having a solid structure may be referred to as "wires", and fibers having a hollow structure may be referred to as "tubes". Conductive fibers having an average short axis length of from 5 to 1,000 nm and an average long axis length of from 1 to 100 μm may be referred to as "nanowires".

Conductive fibers having a hollow structure having an average short axis length of from 1 to 1,000 nm and an average long axis length of from 0.1 to 1,000 μm may be referred to as "nanotubes".

The material of the conductive fibers is not particularly limited as far as it has conductivity, and may be appropriately selected depending on the purpose. At least one of a metal and carbon is preferred, and among these, the conductive fibers are preferably at least one of metal nanowires, metal nanotubes and carbon nanotubes.

Metal Nanowires

Metal

The material of the metal nanowires is not particularly limited and is preferably at least one kind of a metal selected from the group consisting of the fourth period, the fifth period and the sixth period of the long periodic table (IUPAC 1991), more preferably at least one kind of a metal selected from the groups 2 to 14, and further preferably at least one kind of a metal selected from the group 2, the group 8, the group 9, the group 10, the group 11, the group 12, the group 13 and the group 14, which is particularly preferably contained as a major component.

Examples of the metal include copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and alloys thereof. Among these, ones containing silver as a major component and ones containing an alloy of silver and a metal other than silver are preferred.

The term "containing silver as a major component" means that the metal nanowires contain silver in an amount of 50% by mass or more, and preferably 90% by mass or more.

Examples of the metal used in the alloy with silver include platinum, osmium, palladium and iridium. These metals may be used solely or as a combination of two or more kinds thereof.

Shape

The shape of the metal nanowires is not particularly limited and may be appropriately selected depending on the purpose, and an arbitrary shape, such as a circular column shape, a rectangular parallelepiped shape and a column shape having a polygonal cross sectional shape, may be used. In a purpose that requires high transparency, a circular column shape and a shape having a polygonal cross sectional shape with rounded apexes are preferred.

The cross sectional shape of the metal nanowires may be examined in such a manner that a metal nanowire aqueous dispersion liquid is coated on a substrate, and the cross section thereof is observed with a transmission electron microscope (TEM).

Figure 9:
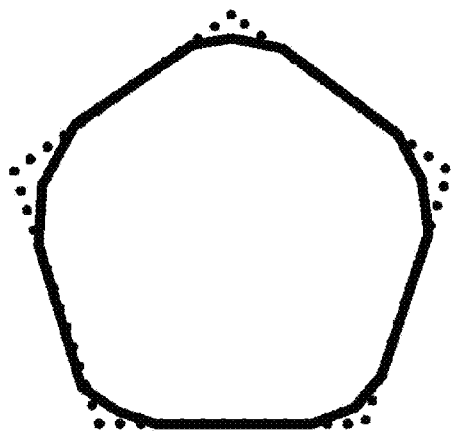
FIG. 9 is an illustrative view showing a cross section of a metal nanowire.

The apex of the cross section of the metal nanowires means such a position that the edges of the cross section are extended, and the vicinity of the point where the perpendicular lines of the adjacent edges intersect each other is designated as the apex of the cross section. The term "edges of the cross section" means the straight line connecting the adjacent apexes. In this case, the ratio of the outer circumferential length of the cross section with respect to the total length of the edges of the cross section is designated as the sharpness. In the cross section of metal nanowires shown in FIG. 9, the sharpness may be expressed by the ratio of the outer circumferential length shown by the solid line and the outer circumferential length of the pentagon shown by the broken line. A cross sectional shape that has a sharpness of 75% or less is designated as a cross sectional shape with rounded apexes. The sharpness is preferably 60% or less, and more preferably 50% or less. When the sharpness exceeds 75%, the transparency may be deteriorated due to yellowness remaining in some cases, which may be expected to be caused by increased plasmon absorption due to electrons localized in the apexes.

Furthermore, the linearity of the edge of the pattern may be deteriorated to form steps in some cases. The lower limit of the sharpness is preferably 30%, and more preferably 40%.

Average Short Axis Length and Average Long Axis Length

The average short axis length of the metal nanowires (which may be referred to as an average short axis diameter or an average diameter) is preferably 150 nm, more preferably from 1 to 40 nm, further preferably from 10 to 40 nm, and particularly preferably from 15 to 35 nm.

When the average short axis length is less than 1 nm, the oxidation resistance may be deteriorated to cause deterioration in the durability in some cases, and when it exceeds 150 nm, scattering may occur due to the metal nanowires to fail to provide sufficient transparency in some case.

The average short axis length of the metal nanowires may be measured in such a manner that 300 pieces of the metal nanowires are observed with a transmission electron microscope (TEM, JEM-2000FX, produced by JEOL, Ltd.), and the average value obtained is designated as the average short axis length of the metal nanowires. In the case where the short axis of the metal nanowires is not a circular shape, the longest short axis length is designated as the short axis length.

The average long axis length of the metal nanowires (which may be referred to as an average length) is preferably from 1 to 40 µm, more preferably from 3 to 35 µm, and further preferably from 5 to 30 µm.

When the average long axis length is less than 1 µm, a dense network may be difficult to form, and a sufficient conductivity may not be obtained in some cases, and when it exceeds 40 µm, the metal nanowires may entwine in the production process to cause aggregates in the production process in some cases.

The average long axis length of the metal nanowires may be measured in such a manner that 300 pieces of the metal nanowires are observed with a transmission electron microscope (TEM, JEM-2000FX, produced by JEOL, Ltd.), and the average value obtained is designated as the average long axis length of the metal nanowires. In the case where the metal nanowires are curved, a circle formed of the curve as a circular arc is considered, and the value calculated from the radius and the curvature of the circle is designated as the long axis length.

The thickness of the conductive photocurable resin layer is preferably from 0.1 to 20 µm, more preferably from 0.5 to 18 µm, and particularly preferably from 1 to 15 µm, from the standpoint of the stability of the coating liquid and the processability including the drying after coating and the developing time on patterning. The content of the conductive fibers with respect to the total solid content of the conductive photocurable resin layer is preferably from 0.01 to 50% by mass, more preferably from 0.05 to 30% by mass, and particularly preferably from 0.1 to 20% by mass, from the standpoint of the conductivity and the stability of the coating liquid.

(4) Plural Second Transparent Electrode Patterns that are Electrically Insulated from First Transparent Electrode Patterns and Contain Plural Pad Portions that are Formed to Extend in Direction Intersecting First Direction The second transparent electrode patterns 4 may be formed by an etching treatment or by using a photosensitive film having a conductive photocurable resin layer. The preferred embodiments in this case are the same as the formation method for the first transparent electrode patterns 3.

(5) Insulating Layer that Electrically Insulates First Transparent Electrode Patterns and Second Electrode Patterns from Each Other The insulating layer 5 may be formed by using the photosensitive film of the invention having an insulating photocurable resin layer as the photocurable resin layer, and transferring the photocurable resin layer to the surface of the front plate 1 having the first transparent electrode patterns formed thereon.

In the case where the insulating layer is formed by using the photosensitive film, the thickness of the photocurable resin layer is preferably from 0.1 to 5 more preferably from 0.3 to 3 µm, and particularly preferably from 0.5 to 2 µm, from the standpoint of the maintenance of the insulating property.

(6) Conductive Element that is Other than First Transparent Electrode Patterns and Second Electrode Patterns and is Electrically Connected to at Least One of First Transparent Electrode Patterns and Second Transparent Electrode Patterns The conductive element 6 may be formed by an etching treatment or by using a photosensitive film having a conductive photocurable resin layer.

(7) Transparent Protective Layer

The transparent protective layer 7 may be formed by using the photosensitive film having a transparent photocurable resin layer as the photocurable resin layer, and transferring the photocurable resin layer to the surface of the front plate 1 having the elements formed thereon.

In the case where the transparent protective layer is formed by using the photosensitive film, the thickness of the photocurable resin layer is preferably from 0.5 to 10 µm, more preferably from 0.8 to 5 µm, and particularly preferably from 1 to 3 µm, from the standpoint of sufficient exertion of the surface protective function.

Capacitance Type Input Device and Image Display Apparatus Containing Capacitance Type Input Device as Constitutional Component For the capacitance type input device that is produced by the production method of the invention and the image display apparatus containing the capacitance type input device as a constitutional component, the constitutions described, for example, in "Saishin Touch Panel Gijutsu" (Newest Touch-sensitive Panel Technology), published by Techno Times Co., Ltd., Jul. 6, 2009, "Touch Panel no Gijutsu to Kaihatsu" (Technology and Development of Touch-sensitive Panels), supervised by Yuji Mitani, CMC Publishing Co., Ltd., December 2004, Textbook for lecture in FPD International 2009 Forum T-11, Cypress Semiconductor Corporation, Application Note AN2292, and the like.

EXAMPLE

The invention will be described more specifically with reference to examples below.

The materials, the amounts used, the ratios, the contents of processes, the procedures of processes, and the like in the examples shown below may be appropriately changed unless they deviate from the substance of the invention. Accordingly, the scope of the invention is not construed as being limited to the specific examples shown below. The "%" and the "part" are based on mass unless otherwise indicated.

Example 1

Preparation of Photosensitive Film of Invention
Preparation of Photosensitive Film of Example 1, as Photosensitive Film L1 for forming Decorative Layer On a polyethylene terephthalate film having a thickness of 75 µm as a provisional support, a coating liquid for a thermoplastic resin layer having the following formulation H1 was coated with a slit nozzle and dried. A coating liquid for an intermediate layer having the following formulation P1 was then coated and dried. A coating liquid for a white photocurable resin layer having the following formulation L1 was then further coated and dried. Thus, a thermoplastic resin layer having a dry thickness of 15.1 μm, an intermediate layer having a dry thickness of 1.6 μm and a white photocurable resin layer having a dry thickness of 35 μm were provided on the provisional support, and finally a protective film (a polypropylene film having a thickness of 12 μm) was adhered under pressure thereon. A transfer material having the provisional support, the thermoplastic resin layer, the intermediate layer (an oxygen shielding film) and the white photocurable resin layer integrated to each other was thus produced and designated as a specimen name, a photosensitive film L1 for forming a decorative layer (a photosensitive film of Example 1).

| Coating Liquid for Thermoplastic Resin Layer, Formulation H1 | |
| --- | --- |
| Methanol | 11.1 parts by mass |
| Propylene glycol monomethyl ether acetate | 6.36 parts by mass |
| Methyl ethyl ketone | 52.4 parts by mass |
| Methyl methacrylate/2-ethylhexyl acrylate/benzyl methacrylate/methacrylic acid copolymer (copolymerization ratio (molar ratio): 55/11.7/4.5/28.8, molecular weight: 100,000, Tg: ca. 70° C.) | 5.83 parts by mass |
| Styrene/acrylic acid copolymer (copolymerization ratio (molar ratio): 63/37, weight average molecular weight: 10,000, Tg: ca. 100° C.) | 13.6 parts by mass |
| Monomer 1 (BPE-500, a trade name, produced by Shin-Nakamura Chemical Co., Ltd.) | 9.1 parts by mass |
| Fluorine polymer | 0.54 part by mass |

The fluorine polymer above was a copolymer of 40 parts of $C_6F_{13}CH_2CH_2OCOCH=CH_2$, 55 parts of $H(OCH(CH_3)CH_2)_2OCOCH=CH_2$ and 5 parts of $H(OCHCH_2)_7OCOCH=CH_2$ having a weight average molecular weight of 30,000 in the form of a 30% by mass methyl ethyl ketone solution (Megafac F780F, a trade name, produced by Dainippon Ink And Chemicals, Inc.).

The coating liquid H1 for a thermoplastic resin layer had a viscosity after removing the solvent at 120° C. of 1,500 Pa·sec.

| Coating Liquid for Intermediate Layer, Formulation P1 | |
| --- | --- |
| Polyvinyl alcohol (PVA205, a trade name, produced by Kuraray Co., Ltd., saponification degree: 88%, polymerization degree: 550) | 32.2 parts by mass |
| Polyvinylpyrrolidone (K-30, a trade name, produced by ISP Japan Co., Ltd.) | 14.9 parts by mass |
| Distilled water | 524 parts by mass |
| Methanol | 429 parts by mass |

| Coating Liquid for White Photocurable Resin Layer, Formulation L1 | |
| --- | --- |
| Methyl ethyl ketone (produced by Tonen Chemical Corporation) | 101 parts by mass |
| Acrybase F187 (produced by Fujikura Kasei Co., Ltd., a random copolymer of benzyl methacrylate/methacrylic acid (molar ratio: 72/28, weight average molecular weight: 30,000, a propylene glycol monomethyl ether acetate solution (solid content: 40.5% by mass) | 179 parts by mass |
| White pigment dispersion 1 (having the following composition) | 157 parts by mass |
| Hydroquinone monomethyl ether | 0.077 part by mass |
| DPHA (dipentaerythritol hexaacrylate, produced by Nippon Kayaku Co., Ltd.) | 55.7 parts by mass |

-continued

| Coating Liquid for White Photocurable Resin Layer, Formulation L1 | |
| --- | --- |
| 2-Methyl-1-(4-methylthiophenyl)-2-morpholinopropan-1-one (Irgacure 709, produced by BASF Japan Co., Ltd.) | 5.99 parts by mass |
| Surfactant (Megafac F-780F, a trade name, produced by Dainippon Ink And Chemicals, Inc.) | 1.0 part by mass |

| Composition of White Pigment Dispersion 1 | |
| --- | --- |
| Titanium oxide (alumina-treated rutile type, primary particle diameter: 0.2 μm) | 70.0% by mass |
| Random copolymer of benzyl methacrylate/methacrylic acid (molar ratio: 72/28, weight average molecular weight: 37,000) | 3.5% by mass |
| Methyl ethyl ketone (produced by Tonen Chemical Corporation) | 26.5% by mass |

Evaluation of Photosensitive Film of Example 1, as Photosensitive Film L1 for Forming Decorative Layer Evaluation of Transfer Property The cover film was released from the photosensitive film L1 for forming a decorative layer (i.e., the photosensitive film of Example 1) thus produced above, which was then adhered with a laminator, and then the provisional support formed of a polyethylene terephthalate film was released. The surface of the film, from which the provisional support had been released, was observed and evaluated according to the following standard. The grade C or better is practical.

Evaluation Standard

A: The layer was completely transferred over the entire surface, providing considerably good transfer property.
B: A slight transfer residue was found only at the edges of the film, providing good transfer property.
C: A slight transfer residue was found over the film, providing average transfer property.
D: A transfer residue of the photosensitive resin in the form of a film was found in some places on the film, providing poor transfer property.

The evaluation results are shown in Table 1 below.

Production of Capacitance Type Input Device of Invention

The photosensitive film of Example 1 thus obtained above was used as a photosensitive film for forming a decorative layer, and a capacitance type input device of Example 1 was produced.

Formation of Decorative Layer

Toughened glass (300 mm×400 mm×0.7 mm) having an opening (diameter: 15 mm) was rinsed with a rotation nylon brush while spraying a glass rinsing liquid controlled to 25° C. by showering thereon for 20 seconds, followed by rinsing with pure water by showering, and then a silane coupling solution (a 0.3% by mass aqueous solution of N-β-(aminoethyl)-γ-aminopropyltrimethoxysilane, KBM603, a trade name, produced by Shin-Etsu Chemical Co., Ltd.) was sprayed by showering thereon for 20 seconds, followed by rinsing with pure water by showering. The substrate was heated to 140° C. for 2 minutes with a substrate preheating equipment. The cover film was removed from the photosensitive film L1 for forming a decorative layer (photosensitive film of Example 1), and the surface of the white photocurable resin layer thus exposed by the removal and the surface of the glass substrate having been subjected to the silane coupling treatment obtained above were made in contact with and superimposed on each other, and were laminated by using a laminator (Model Lamic II, produced by Hitachi Industries Co., Ltd.) with the substrate being beated to 120° C. at a rubber roller temperature of 120° C., a linear pressure of 100 N/cm and a conveying speed of 2.5 m/min. Subsequently, the polyethylene terephthalate provisional support was released at the interface to the thermoplastic resin layer to remove the provisional support. After releasing the provisional support, the substrate and an exposure mask (which was a quartz exposure mask having a flame pattern) were set up vertically and exposed patternwise at a distance between the surface of the exposure mask and the white photocurable resin layer of 500 μm and an exposure amount of 1,000 mJ/cm² (i line) by using a proximity exposure machine having a super-high pressure mercury lamp (produced by Hitachi High-Tech Electronics Engineering Co., Ltd.).

The photosensitive film was developed by showering a triethanolamine developer liquid (which was obtained by diluting 10 times T-PD2, a trade name, produced by Fujifilm Corporation, containing 30% by mass of triethanolamine, with pure water) at 30° C. for 60 seconds at a flat nozzle pressure of 0.1 MPa, so as to remove the thermoplastic resin layer and the intermediate layer. Subsequently, the liquid was drained by blowing air onto the upper surface of the glass substrate, and then the substrate was rinsed with pure water by showering by spraying pure water by showering for 10 seconds, followed by blowing air thereon to reduce the liquid accumulated on the substrate.

Thereafter, a sodium carbonate/potassium hydrogen carbonate developer liquid (which was obtained by diluting 5 times T-CD1, a trade name, produced by Fujifilm Corporation, with pure water) was set to 35° C. and a shower pressure of 0.1 MPa, and the period of time, in which the non-exposed region was completely developed, (hereinafter referred to as a break point) was obtained. The substrate was developed therewith for a developing time that was 1.5 times the break point, followed by rinsing with pure water. The break point for the photosensitive film L1 for a decorative layer (photosensitive film of Example 1) was 110 seconds.

Subsequently, a surfactant-containing rinsing liquid (which was obtained by diluting 10 times T-SE3, a trade name, produced by Fujifilm Corporation, with pure water) was sprayed thereon by showering at 33° C. for 44 seconds at a cone type nozzle pressure of 0.1 MPa, and the pattern image thus formed was rubbed with a soft nylon rotation brush to remove the residue. Furthermore, super-pure water was sprayed thereon at a pressure of 8 MPa with a super-high pressure rinsing nozzle to remove the residue, water was drained with an air knife, and the substrate was dried in an oven at 80° C. for 10 minutes.

The substrate was post-exposed in the air from both the front and back surfaces thereof at an exposure amount of 1,300 mJ/cm², and was post-baked in a vacuum oven under a condition of 15 mmHg or less at 240° C. for 30 minutes, thereby providing a front plate having a decorative layer having a thickness of μm formed thereon. The front plate was measured for brightness from the surface thereof having no decorative layer formed thereon, and thus the L value was 83.4. The whiteness thereof was determined visually, and thus the whiteness was in good level without problem.
Measurement of Thickness The thickness of the decorative layer in the front plate formed of toughened glass having formed thereon the decorative layer was measured with a surface roughness meter, P-10 (produced by KLA-Tencor Corporation). The results are shown in Table 1 below.
Evaluation of Front Plate Having Decorative Layer Formed Thereon
Evaluation of Reticulation The front plate formed of toughened glass having formed thereon the decorative layer was allowed to stand under an environment of 23° C. and 50% RH for 24 hours, and then the surface of the decorative layer and the surface of the front plate having no decorative layer formed were observed with a microscope with reflected light and transmitted light and evaluated according to the following standard. The grade C or better is practical.
Evaluation Standard
A: No formation of fine wrinkles was observed on the surface of the pattern of the decorative layer, providing excellent quality.
B: Formation of extremely weak fine wrinkles was observed in a part of the center portion of the surface of the pattern of the decorative layer, but was not recognized from the surface opposite to the side having the decorative layer formed, providing good quality.
C: Formation of slight fine wrinkles was observed on the surface of the pattern of the decorative layer, was not recognized from the surface opposite to the side having the decorative layer formed, providing average quality with no practical problem.
D: Formation of significant fine wrinkles was observed, and weak unevenness was observed from the surface opposite to the side having the decorative layer formed, providing poor quality.
E: Formation of fine wrinkles was observed over the entire surface, and unevenness was observed from the surface opposite to the side having the decorative layer formed, providing extremely poor quality.

The evaluation results are shown in Table 1 below.
Evaluation of Yield 500 sheets of the front plates each formed of toughened glass having formed thereon the decorative layer were produced, and the yield of the usable products was obtained.
Evaluation Standard
A: The yield exceeded 94%, providing an excellent level.
B: The yield was 91% or more and less than 94%, providing a good level.
C: The yield was 88% or more and less than 91%, providing an average level.
D: The yield was 83% or more and less than 88%, providing a poor level.
E: The yield was less than 83%, providing an extremely poor level.

The evaluation results are shown in Table 1 below.
Evaluation of Adhesion of Decorative Layer The decorative layer on the front plate formed of toughened glass having formed thereon the decorative layer was cut in a 1-mm width according to JIS K5600-5-6, ISO 2409 (cross cut method), and peeled off with an adhesive cellophane tape, and the presence of peel-off and pinhole was observed on the surface of the decorative layer. The grade C or better is practical.
Evaluation Standard
A: The decorative layer was completely not peeled off and adhered, providing an excellent level.
B: The decorative layer was slightly peeled off at the edge of the cut, but the cross-cut portion was not peeled off, providing a good level.

C: The peel-off of the cross-cut portion of the decorative layer was 0% or more and less than 2%, providing a practically average level.
D: The peel-off of the cross-cut portion of the decorative layer was 2% or more and less than 5%, which required repair, providing a poor level.
E: The peel-off of the cross-cut portion of the decorative layer was 5% or more, which required repair, providing an extremely poor level.

The evaluation results are shown in Table 1 below.

Evaluation of Development Residue

After developing the decorative layer, the boundary of the decorative pattern thus formed and the surrounding portion thereof were observed with SEM, and the presence of the residue in the boundary and the surrounding portion was evaluated according to the following standard. The grade C or better is practical.

Evaluation Standard
A: No residue was observed, providing an excellent level.
B: A slight amount of a residue was observed only in the boundary of the decorative pattern, providing a good level.
C: A small amount of a residue was observed in the boundary of the decorative pattern, but no residue was observed in the other portions, providing an average level with no practical problem.
D: A large amount of a residue was observed in the boundary of the decorative pattern, or a residue was observed not only in the surrounding portion of the decorative pattern but also in the other portions on the substrate, providing a poor level.
E: A residue was observed over the entire surface of the substrate, providing an extremely poor level.

The evaluation results are shown in Table 1 below.

Evaluation of Unevenness

The decorative layer formed on the toughened glass was observed from the front and back surfaces of the substrate by 60 subjects, and evaluated for unevenness according to the following standard. The grade C or better is practical. Evaluation Standard
A: Number of subjects who recognized unevenness: 0 to 1
B: Number of subjects who recognized unevenness: 2 to 3
C: Number of subjects who recognized unevenness: 4 to 5
D: Number of subjects who recognized unevenness: 6 to 10
E: Number of subjects who recognized unevenness: 11 or more The evaluation results are shown in Table 1 below.

Evaluation of Contamination of Opening

The opening of the front plate formed of toughened glass having formed thereon the decorative layer was observed with a microscope for the presence of the component of the decorative layer as contamination.

Evaluation Standard
A: No contamination of the component of the decorative layer was attached to the opening, providing excellent quality.
B: Slight contamination of the component of the decorative layer was attached only to the edge of the opening, but was in a usable level, providing good quality
C: Contamination of the component of the decorative layer was attached to a region of several micrometer inside from the edge of the opening, but was practically usable, providing an average quality.
D: Contamination of the component of the decorative layer was attached to a region from the edge of the opening up to the halfway of the thickness of glass, which practically required repair, providing poor quality.
E: Contamination of the component of the decorative layer was attached to a region from the edge of the opening through the inside of the opening up to the back surface of glass, providing extremely poor quality.

The evaluation results are shown in Table 1 below.

Evaluation of Missing at Opening

The vicinity of the opening of the front plate formed of toughened glass having formed thereon the decorative layer was observed with a microscope for the presence of drop-off and pinhole in the decorative layer.

Evaluation Standard
A: No drop-off was present in the decorative layer on the substrate in the vicinity of the opening, providing an excellent level.
B: Slight drop-off was present only in the edge of the opening, but no drop-off was present in the other portions, providing a good level.
C: Drop-off of the component of the decorative layer was found in a region of several micrometer from the edge of the opening, providing average quality with no practical problem.
D: Drop-off of the component of the decorative layer was found in a region with a width of several millimeter from the edge of the opening, which practically required repair, providing poor quality.
E: Drop-off of the component of the decorative layer was found in a region with a width of several centimeter from the edge of the opening, which practically required repair, providing extremely poor quality.

Formation of Mask Layer

Preparation of Photosensitive Film K1 for Forming Mask Layer

A photosensitive film K1 for forming a mask layer was obtained in the same manner as in the preparation of the photosensitive film L1 for forming a decorative layer (i.e., the photosensitive film of Example 1) except that the coating liquid for a white photocurable resin layer in the preparation of the photosensitive film L1 for forming a decorative layer (i.e., the photosensitive film of Example 1) was changed to a coating liquid for a photocurable resin layer for forming a mask layer having the following formulation K1 (the thickness of the photocurable resin layer for a mask layer was 2.2 µm).

| Coating Liquid for Black Photocurable Resin Layer | |
|---|---|
| K pigment dispersion 1 (having the following composition) | 31.2 parts by mass |
| R pigment dispersion 1 (having the following composition) | 3.3 parts by mass |
| MMPGAc (produced by Daicel Chemical Industries, Ltd.) | 6.2 parts by mass |
| Methyl ethyl ketone (produced by Tonen Chemical Corporation) | 34.0 parts by mass |
| Cyclohexanone (produced by Kanto Denka Kogyo Co., Ltd.) | 8.5 parts by mass |
| Binder 2 (a random copolymer of benzyl methacrylate/methacrylic acid (molar ratio: 78/22, weight average molecular weight: 38,000) | 10.8 parts by mass |
| Phenothiazine (produced by Tokyo Chemical Industry Co., Ltd.) | 0.01 part by mass |
| Propylene glycol monomethyl ether acetate solution of DPHA (dipentaerythritolhexaacrylate, produced by Nippon Kayaku Co., Ltd.) (76% by mass) | 5.5 parts by mass |
| 2,4-Bis(trichloromethyl)-6-[4'-(N,N-bis(ethoxycarbonylmethyl) amino-3-bromophenyl)-s-triazine | 0.4 part by mass |

-continued

| Coating Liquid for Black Photocurable Resin Layer | |
|---|---|
| Surfactant (Megafac F-780F, a trade name, produced by Dainippon Ink And Chemicals, Inc.) | 0.1 part by mass |

| Composition of K Pigment Dispersion 1 | |
|---|---|
| Carbon black (Nipex 35, a trade name, produced by Degussa AG) | 13.1% by mass |
| Dispersant 1 shown below | 0.65% by mass |
| Binder 1 (a random copolymer of benzyl methacrylate/ methacrylic acid (molar ratio: 72/28, weight average molecular weight: 37,000) | 6.72% by mass |
| Propylene glycol monomethyl ether acetate | 79.53% by mass |

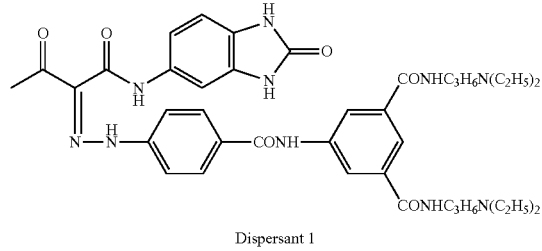

Dispersant 1

| Composition of R Pigment Dispersion 1 | |
|---|---|
| Pigment (C.I. Pigment Red 177) | 18% by mass |
| Binder 1 (a random copolymer of benzyl methacrylate/methacrylic acid (molar ratio: 72/28, weight average molecular weight: 37,000) | 12% by mass |
| Propylene glycol monomethyl ether acetate | 70% by mass |

Formation of Mask Layer

The front plate having the decorative layer was rinsed in the same manner as in the formation of the decorative layer, to which the photosensitive film K1 for etching, from which the cover film had been removed, was laminated (substrate temperature: 140° C., rubber roller temperature: 130° C., linear pressure: 100 N/cm, conveying speed: 2.2 m/min). After releasing the provisional support, the front plate and an exposure mask (which was a quartz exposure mask having a flame pattern) were exposed patternwise at a distance between the surface of the exposure mask and the photocurable resin layer for etching of 200 μm and an exposure amount of 70 mJ/cm$^2$ (i line).

The photosensitive film was developed with a triethanolamine developer liquid (which was obtained by diluting 10 times T-PD2, a trade name, produced by Fujifilm Corporation, containing 30% by mass of triethanolamine, with pure water) at 33° C. for 600 seconds and with a sodium carbonate/sodium hydrogen carbonate developer liquid (which was obtained by diluting 5 times T-CD1, a trade name, produced by Fujifilm Corporation, with pure water) at 32° C. for 45 seconds at a shower pressure of 0.1 MPa, followed by rinsing with pure water.

Subsequently, a surfactant-containing rinsing liquid (which was obtained by diluting 10 times T-SD3, a trade name, produced by Fujifilm Corporation, with pure water) was sprayed thereon by showering at 33° C. for 20 seconds at a cone type nozzle pressure of 0.1 MPa, and the pattern image thus formed was rubbed with a soft nylon rotation brush to remove the residue. Furthermore, super-pure water was sprayed thereon at a pressure of 9.8 MPa with a super-high pressure rinsing nozzle to remove the residue.

The substrate was post-exposed in the air from both the front and back surfaces thereof at an exposure amount of 1,300 mJ/cm$^2$, and was post-baked at 240° C. for 80 minutes, thereby providing the front plate having a mask layer having an optical density of 4.0 and a thickness of 2.0 μm and the decorative layer in the order of the front plate, the decorative layer and the mask layer.

Evaluation of Front Plate Having Decorative Layer and Mask Layer Formed Thereon

Evaluation of Brightness

The front plate formed of toughened glass having formed thereon the decorative layer and the mask layer was measured with 938 Spectrodensitometer, produced by X-Rite GmbH, from the surface thereof opposite to the surface having the decorative layer formed thereon, with black paper laid under the front plate, for evaluating the brightness in terms of L value. The grade D or better is practical, and the grade C or better is preferred.

A: L value of 83 or more
B: L value of 82 or more and less than 83
C: L value of 80 or more and less than 82
D: L value of 77 or more and less than 80
E: L value of less than 77

The evaluation results are shown in Table 1 below.

Evaluation of Whiteness

The front plate formed of toughened glass having formed thereon the decorative layer and the mask layer was observed from the front and back surfaces of the substrate by 60 subjects, and evaluated for whiteness according to the following standard. The grade C or better is practical.

Evaluation Standard

A: Number of subjects who recognized yellowness: 0 to 1
B: Number of subjects who recognized yellowness: 2 to 3
C: Number of subjects who recognized yellowness: 4 to 5
D: Number of subjects who recognized yellowness: 6 to 10
E: Number of subjects who recognized yellowness: 11 or more The evaluation results are shown in Table 1 below.

Formation of First Transparent Electrode Patterns

Formation of Transparent Electrode Layer

The front plate having the decorative layer formed thereon was placed in a vacuum chamber, and an ITO thin film having a thickness of 40 nm was formed thereon by using an ITO target having an SnO$_2$ content of 10% by mass (indium/tin: 95/5 (molar ratio)) by DC magnetron sputtering (condition: substrate temperature: 250° C., argon pressure: 0.13 Pa, oxygen pressure: 0.01 Pa), so as to form an ITO thin film having a thickness of 40 nm, thereby providing the front plate having a transparent electrode layer formed thereon. The ITO thin film had a surface resistance of 80Ω per square.

Preparation of Photosensitive Film E1 for Etching

A photosensitive film E1 for etching was obtained in the same manner as in the preparation of the photosensitive film L1 for forming a decorative layer except that the coating liquid for a white photocurable resin layer in the preparation of the photosensitive film L1 for forming a decorative layer was changed to a coating liquid for a photocurable resin layer for etching having the following formulation E1 (the thickness of the photocurable resin layer for etching was 2.0 μm).

| Coating Liquid for Photocurable Resin Layer for Etching, Formulation E1 | |
|---|---|
| Copolymer of methyl methacrylate/styrene/ methacrylic acid (copolymerization ratio (% by mass): 31/40/29, mass average molecular weight: 60,000, acid value: 163 mgKOH/g) | 16 parts by mass |
| Monomer 1 (BPE-500, a trade name, produced by Shin-Nakamura Chemical Co., Ltd.) | 5.6 parts by mass |
| Tetraethylene oxide monomethacrylate 0.5 mol adduct of hexamethylene diisocyanate | 7 parts by mass |
| Cyclohexanedimethanol monoacrylate as compound having one polymerizable group in molecule | 2.8 parts by mass |
| 2-Chloro-N-butylacridone | 0.42 part by mass |
| 2,2-Bis(o-chlorophenyl)-4,4',5,5'-tetraphenylbiimidazole | 2.17 parts by mass |
| Leuco Crystal Violet | 0.26 part by mass |
| Phenothiazine | 0.013 part by mass |
| Surfactant (Megafac F-780F, a trade name, produced by Dainippon Ink And Chemicals, Inc.) | 0.03 part by mass |
| Methyl ethyl ketone | 40 parts by mass |
| 1-Methoxy-2-propanol | 20 parts by mass |

Formation of First Transparent Electrode Patterns

The front plate having the transparent electrode layer was rinsed in the same manner as in the formation of the decorative layer, to which the photosensitive film E1 for etching, from which the cover film had been removed, was laminated (substrate temperature: 130° C., rubber roller temperature: 120° C., linear pressure: 100 N/cm, conveying speed: 2.2 m/min). After releasing the provisional support, the front plate and an exposure mask (which was a quartz exposure mask having transparent electrode patterns) were exposed patternwise at a distance between the surface of the exposure mask and the photocurable resin layer for etching of 200 μm and an exposure amount of 50 mJ/cm² (i line).

The photosensitive film was then developed with a triethanolamine developer liquid (which was obtained by diluting 10 times T-PD2, a trade name, produced by Fujifilm Corporation, containing 30% by mass of triethanolamine, with pure water) at 25° C. for 100 seconds, then treated with a surfactant-containing rinsing liquid (which was obtained by diluting 10 times T-SD3, a trade name, produced by Fujifilm Corporation, with pure water) at 33° C. for 20 seconds with a rotation brush and a super-high pressure rinsing nozzle to remove the residue, and then post-baked at 130° C. for 30 minutes, thereby providing the front plate having the transparent electrode layer and a photocurable resin layer pattern for etching.

The front plate having formed thereon the transparent electrode layer and the photocurable resin layer pattern for etching was immersed in an ITO etchant (a hydrochloric acid and potassium chloride aqueous solution, liquid temperature: 30° C.) in an etching bath and treated for 100 seconds to dissolve and remove the transparent electrode layer that was exposed but not covered with the photocurable resin layer for etching, thereby providing the front plate having transparent electrode patterns with the photocurable resin layer pattern for etching.

Subsequently, the front plate having the transparent electrode patterns with the photocurable resin layer pattern for etching was immersed in a resist removing liquid (N-methyl-2-pyrrolidone, monoethanolamine and a surfactant (Surfynol 465, a trade name, produced by Air Products and Chemicals, Inc.), liquid temperature: 45° C.) in a resist removing bath and treated for 200 seconds to remove the photocurable resin layer pattern for etching, thereby providing the front plate having the decorative layer, the mask layer, and the first transparent electrode patterns that were provided over both regions in the non-contact surface of the front plate and a surface of the mask layer that is opposite to the front plate.

Formation of Insulating Layer
Preparation of Photosensitive Film W1 for Forming Insulating Layer A photosensitive film W1 for forming an insulating layer was obtained in the same manner as in the preparation of the photosensitive film L1 for forming a decorative layer except that the coating liquid for a white photocurable resin layer in the preparation of the photosensitive film L1 for forming a decorative layer was changed to a coating liquid for a photocurable resin layer for forming an insulating layer having the following formulation W1 (the thickness of the photocurable resin layer for forming an insulating layer was 1.4 μm).

| Coating Liquid for forming Insulating Layer, Formulation W1 | |
|---|---|
| Binder 3 (a 1-methoxy-2-propanol and methyl ethyl ketone solution of a glycidyl methacrylate (d) adduct of a copolymer of cyclohexyl methacrylate (a)/methyl methacrylate(b)/ methacrylic acid (c) (composition (% by mass): a/b/c/d = 46/1/10/43, mass average molecular weight: 36,000, acid value: 66 mgKOH/g) (solid content: 45%) | 12.5 parts by mass |
| Propylene glycol monomethyl ether acetate solution of DPHA (dipentaerythritol hexaacrylate, produced by Nippon Kayaku Co., Ltd.) (76% by mass) | 1.4 parts by mass |
| Urethane monomer (NK Oligo UA-32P, a trade name, produced by Shin-Nakamura Chemical Co., Ltd., non-volatile content: 75%, propylene glycol monomethyl ether acetate: 25%) | 0.68 part by mass |
| Pentaerythritol octaacrylate (V #802, a trade name, produced by Osaka Organic Chemical Industry, Ltd.) | 1.8 parts by mass |
| Diethylthioxanthone | 0.17 part by mass |
| 2-(Dimethylamino)-2-[(4-methylphenyl) methyl]-1-[4-(4-morpholinyl)phenyl]-1-butanone (Irgacure 379, a trade name, produced by BASF Japan Co., Ltd.) | 0.17 part by mass |
| Dispersant (Solsperse 20000, a trade name, produced by Avecia, Inc.) | 0.19 part by mass |
| Surfactant (Megafac F-780F, a trade name, produced by Dainippon Ink And Chemicals, Inc.) | 0.05 part by mass |
| Methyl ethyl ketone | 23.3 parts by mass |
| MMPGAc (produced by Daicel Chemical Industries, Ltd.) | 59.8 parts by mass |

The coating liquid W1 for forming an insulating layer had a viscosity after removing the solvent at 100° C. of 4,000 Pa·sec.

The front plate having the first transparent electrode patterns was rinsed and subjected to the silane coupling treatment in the same manner as in the formation of the decorative layer, to which the photosensitive film W1 for forming an insulating layer, from which the cover film had been removed, was laminated (substrate temperature: 100° C., rubber roller temperature: 120° C., linear pressure: 100 N/cm, conveying speed: 2.3 m/min). After releasing the provisional support, the front plate and an exposure mask (which was a quartz exposure mask having a pattern for an insulating layer) were exposed patternwise at a distance between the surface of the exposure mask and the photocurable resin layer for forming an insulating layer of 100 μm and an exposure amount of 30 mJ/cm² (i line).

The photosensitive film was then developed with a triethanolamine developer liquid (which was obtained by diluting 10 times T-PD2, a trade name, produced by Fujifilm Corporation, containing 30% by mass of triethanolamine, with pure water) at 33° C. for 60 seconds and with a sodium carbonate/sodium hydrogen carbonate developer liquid (which was obtained by diluting 5 times T-CD1, a trade name, produced by Fujifilm Corporation, with pure water) at 25° C. for 50 seconds, then treated with a surfactant-containing rinsing liquid (which was obtained by diluting 10 times T-SD3, a trade name, produced by Fujifilm Corporation, with pure water) at 33° C. for 20 seconds with a rotation brush and a super-high pressure rinsing nozzle to remove the residue, and then post-baked at 230° C. for 60 minutes, thereby providing the front plate having the decorative layer, the mask layer, the first transparent electrode patterns and the insulating layer pattern.

Formation of Second Transparent Electrode Patterns
Formation of Transparent Electrode Layer An ITO thin film having a thickness of 80 nm was formed on the front plate having formed thereon the first transparent electrode patterns and the insulating layer pattern by DC magnetron sputtering (condition: substrate temperature: 50° C., argon pressure: 0.13 Pa, oxygen pressure: 0.01 Pa) in the same manner as in the formation of the first transparent electrode patterns, so as to form an ITO thin film having a thickness of 80 nm, thereby providing the front plate having a transparent electrode layer formed thereon. The ITO thin film had a surface resistance of 110Ω per square.

The front plate having formed thereon the first transparent electrode patterns, the insulating layer pattern, the transparent electrode layer and a photocurable resin layer pattern for etching was obtained by using the photosensitive film E1 for etching in the same manner as in the formation of the first transparent electrode patterns (post-baking treatment: 130° C. for 30 minutes).

The etching (30° C. for 50 seconds) and the removal of the photocurable resin layer for etching (45° C. for 200 seconds) were performed in the same manner as in the formation of the first transparent electrode patterns, thereby providing the front plate having the decorative layer, the mask layer, the first transparent electrode patterns, the insulating layer pattern, and the second transparent electrode patterns that were provided both regions in the non-contact surface of the front plate and a surface of the mask layer that is opposite to the front plate.

Formation of Conductive Element Other than from First and Second Transparent Electrode Patterns The front plate having formed thereon the first transparent electrode patterns, the insulating layer patterns and the second transparent electrode patterns was subjected to a DC magnetron sputtering treatment in the same manner as in the formation of the first and second transparent electrode patterns, thereby providing the front plate having an aluminum (Al) thin film having a thickness of 200 nm formed thereon.

The front plate having formed thereon the first transparent electrode patterns, the insulating layer pattern, the second transparent electrode patterns and a photocurable resin layer pattern for etching was obtained by using the photosensitive film E1 for etching in the same manner as in the formation of the first and second transparent electrode patterns (post-baking treatment: 130° C. for 30 minutes).

The etching (30° C. for 50 seconds) and the removal of the photocurable resin layer for etching (45° C. for 200 seconds) were performed in the same manner as in the formation of the first transparent electrode patterns, thereby providing the front plate having the decorative layer, the mask layer, the first transparent electrode patterns, the insulating layer pattern, the second transparent electrode patterns, and a conductive pattern other than the first and second transparent electrode patterns.

Formation of Transparent Protective Layer

The front plate having formed thereon until the conductive element other than the first and second transparent electrode patterns was laminated with the photosensitive film W1 for forming an insulating layer, from which the cover film had been removed, and after removing the provisional support, the front plate was subjected to exposure from the front surface thereof without an exposure mask at an exposure amount of 50 mJ/cm$^2$ (i line), development, post-exposure (1,000 mJ/cm$^2$) and post-baking, in the same manner as in the formation of the insulating layer, thereby providing the front plate 1 having laminated thereon an insulating layer (i.e., a transparent protective layer) that covered all the mask layer, the first transparent electrode patterns, the insulating layer pattern, the second transparent electrode patterns and the conductive element other than the first and second transparent electrode patterns. The front plate 1 thus obtained was designated as a capacitance type input device of Example 1.

Production of Image Display Apparatus (Touch-Sensitive Panel)

The front plate 1 (i.e., the capacitance type input device of Example 1) thus produced was laminated on a liquid crystal display device produced by the method described in JP-A-2009-47936, and an image display apparatus 1 of Example 1 having the capacitance type input device as a constitutional element was produced by a known method.

Total Evaluation of Front Plate 1 and Image Display Apparatus 1

In all the process steps above, the front plate 1 (i.e., the capacitance type input device of Example 1) having the decorative layer, the mask layer, the first transparent electrode patterns, the insulating layer pattern, the second transparent electrode patterns, and the conductive element other than the first and second transparent electrode patterns was free of contamination in the opening and the back surface, was easily rinsed, and was free of a problem of contaminating other members.

The decorative layer was free of pinhole and had no problem in whiteness and unevenness. The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Example 2

Production of Photosensitive Film C1 Having Conductive Photocurable Resin Layer Laminated Thereon A photosensitive film C1 having a conductive photocurable resin layer laminated thereon was obtained in the same manner as in the preparation of the photosensitive film L1 for forming a decorative layer except that the coating liquid for a white photocurable resin layer in the preparation of the photosensitive film L1 for forming a decorative layer was changed to a coating liquid for forming a conductive photocurable resin layer having the following formulation C1 (the thickness of the conductive photocurable resin layer was 2.0 µm).

Preparation of Coating Liquid for Forming Conductive
Photocurable Resin Layer
Preparation of Silver Nanowire Dispersion (1)

0.51 g of silver nitride powder was dissolved in 50 mL of pure water to prepare a silver nitride solution. Thereafter, 1N aqueous ammonia was added to the silver nitride solution until the solution became transparent, and pure water was added thereto to make a total amount of 100 mL, so as to prepare an additive liquid A.

0.5 g of glucose powder was dissolved in 140 mL of pure water to prepare an additive liquid G.

0.5 g of HTAB (hexadecyltrimethylammonium bromide) powder was dissolved in 27.5 mL of pure water to prepare an additive liquid H.

20.6 mL of the additive liquid A was placed in a three-neck flask and stirred at room temperature. 41 mL of pure water, 20.6 mL of the additive liquid H and 16.5 mL of the additive liquid G were added in this order to the additive liquid A, and the mixture was heated to 90° C. for 5 hours under stirring at 200 rpm, thereby providing a silver nanowire aqueous dispersion (1).

After cooling the resulting silver nanowire aqueous dispersion (1), polyvinylpyrrolidone (K-30, a trade name, produced by Wako Pure Chemical Industries, Ltd.) was added thereto in an amount of 0.05 in mass per 1 of the mass of silver under stirring. Thereafter, the mixture was centrifugally separated, purified until the conductivity became 50 µS/cm or less, and further centrifugally separated with propylene glycol monomethyl ether, from which water was removed, and finally propylene glycol monomethyl ether was added thereto, thereby preparing a silver nanowire solvent dispersion (1).

Preparation of Coating Liquid C1 for Forming Conductive
Photocurable Resin Layer The following composition was stirred, and further mixed with the silver nanowire dispersion (1) to make a final silver concentration of 1.0% by mass, thereby preparing a coating liquid C1 for forming a conductive photocurable resin layer.

| Composition of Coating Liquid C1 for forming Conductive Photocurable Resin Layer | |
|---|---|
| Binder 3 shown above (solid content: 45%) | 3.80 parts by mass |
| Kayarad DPHA (produced by Nippon Kayaku Co., Ltd.) | 1.59 parts by mass |
| 2-(Dimethylamino)-2-[(4-methylphenyl)methyl]-1-[4-(4-morpholinyl)phenyl]-1-butanone (Irgacure 379, a trade name, produced by BASF Japan Co., Ltd.) | 0.159 part by mass |
| EHPE-3150 (produced by Daicel Chemical Industries, Ltd.) | 0.150 part by mass |
| Surfactant (Megafac F-781F, a trade name, produced by Dainippon Ink And Chemicals, Inc.) | 0.002 part by mass |
| MMPGAc (produced by Daicel Chemical Industries, Ltd.) | 19.3 parts by mass |

Formation of Transparent Electrode Patterns, Insulating Layer, Etc.

A front plate having a decorative layer and a mask layer formed thereon was obtained in the same manner as in Example 1, and then first transparent electrode patterns were formed by using the photosensitive film C1 having the conductive photocurable resin layer laminated thereon.

The front plate having formed thereon the mask layer was rinsed, and the photosensitive film C1, from which the cover film had been removed, was laminated thereon (substrate temperature: 120° C., rubber roller temperature: 120° C., line pressure: 100 N/cm, conveying speed: 1.7 m/min). After releasing the provisional support, the front plate and an exposure mask (which was a quartz exposure mask having a pattern for the transparent electrode patterns) were exposed patternwise at a distance between the surface of the exposure mask and the photocurable resin layer for etching of 100 µm and an exposure amount of 100 mJ/cm$^2$ (i line).

The photosensitive film was then developed with a triethanolamine developer liquid (which was obtained by diluting 10 times T-PD2, a trade name, produced by Fujifilm Corporation, containing 30% by mass of triethanolamine, with pure water) at 30° C. for 60 seconds and with a sodium carbonate/sodium hydrogen carbonate developer liquid (which was obtained by diluting 5 times T-CD1, a trade name, produced by Fujifilm Corporation, with pure water) at 25° C. for 60 seconds, then treated with a surfactant-containing rinsing liquid (which was obtained by diluting 10 times T-SD3, a trade name, produced by Fujifilm Corporation, with pure water) at 33° C. for 20 seconds with a rotation brush and a super-high pressure rinsing nozzle to remove the residue, and then post-baked at 230° C. for 60 minutes, thereby providing the front plate having the mask layer and the first transparent electrode patterns.

Subsequently, an insulating layer was formed in the same manner as in Example 1. Then second transparent electrode patterns were formed by using the photosensitive film C1 having the conductive photocurable resin layer laminated thereon. A conductive element other than the first and second transparent electrode patterns and a transparent protective layer were formed in the same manner as in Example 1, thereby providing a front plate 2. The front plate 2 thus obtained was designated as a capacitance type input device of Example 2.

An image display apparatus 2 of Example 2 was produced in the same manner as in Example 1.

Evaluation of Front Plate 2 and Image Display Apparatus 2

In all the process steps above, the front plate 2 having the decorative layer, the mask layer, the first transparent electrode patterns, the insulating layer pattern, the second transparent electrode patterns, and the conductive element other than the first and second transparent electrode patterns was free of contamination in the opening and the back surface, was easily rinsed, and was free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 3 and 4

Photosensitive films for forming a decorative layer of Examples 3 and 4 were produced in the same manner as in Example 1 except that the formulations L3 and L4 were used instead of the formulation L1 of the coating liquid for a white photocurable resin layer in Example 1, and the monomer/binder ratio was changed to those shown in Table 1. Front plates having formed thereon a decorative layer were formed in the same manner as in Example 1 except that the photosensitive films for forming a decorative layer of Examples 3 and 4 thus produced, and evaluated. The evaluation results are shown in Table 1. Thereafter, front plates 3 and 4, which were capacitance type input devices of Examples 3 and 4, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 3 and 4 having the capacitance type input device as a constitutional element were produced, in the same manner as in Example 1.

The front plate 3, as compared to the front plate 1, was slightly lower in the brightness, the whiteness, the unevenness, the contamination at the opening, the reticulation, the yield and the like, but was practical, and was improved in the adhesion of the decorative layer, the development residue and the missing at the opening.

The front plate 4, as compared to the front plate 1, was slightly lower in the adhesion of the decorative layer, the development residue, the missing at the opening, and the like, but was practical, and was improved in the brightness, the whiteness, the unevenness, the contamination at the opening, the reticulation and the yield.

The front plates 3 and 4 were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 5 to 10

Photosensitive films for forming a decorative layer of Examples 5 to 10 were produced in the same manner as in Example 1 except that the formulations L5 to L10 were used instead of the formulation L1 of the coating liquid for a white photocurable resin layer in Example 1, and the titanium oxide content/solid content ratio was changed to those shown in Table 1. Front plates having formed thereon a decorative layer were formed in the same manner as in Example 1 except that the photosensitive films for forming a decorative layer of Examples 5 to 10 thus produced, and evaluated. The evaluation results are shown in Table 1. Thereafter, front plates 5 to 10, which were capacitance type input devices of Examples 5 to 10, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 5 to 10 having the capacitance type input device as a constitutional element were produced, in the same manner as in Example 1.

The front plates 5 to 10 were slightly lower in the adhesion of the decorative layer, the development residue, the missing at the opening, and the like with the increase of the proportion of titanium oxide with respect to the mass of the total solid content, but were practical, and were improved in the whiteness, the unevenness, the contamination at the opening, the reticulation and the yield. The front plates were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 11 and 12

Photosensitive films for forming a decorative layer of Examples 11 and 12 were produced in the same manner as in Example 1 except that the formulation L11 (Example 11, initiator: Irgacure 127, produced by BASF Japan Co., Ltd.) and the formulation L12 (Example 12, initiator: Lunar 6, produced by DKSH Japan K.K.) were used instead of the formulation L1 of the coating liquid for a white photocurable resin layer in Example 1, and the species of the initiator, the initiator/monomer ratio and the exposure amount were changed to those shown in Table 1. Front plates having formed thereon a decorative layer were formed in the same manner as in Example 1 except that the photosensitive films for forming a decorative layer of Examples 11 and 12 thus produced, and evaluated. The evaluation results are shown in Table 1. Thereafter, front plates 11 and 12, which were capacitance type input devices of Examples 11 and 12, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 11 and 12 having the capacitance type input device as a constitutional element were produced, in the same manner as in Example 1.

The front plates 11 and 12 were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 13 and 14

Photosensitive films for forming a decorative layer of Examples 13 and 14 were produced in the same manner as in Example 1 except that formulations L13 and L14 of the coating liquid for a white photocurable resin layer, in which titanium oxide having a primary particle diameter of 0.2 μm (the white pigment dispersion 1) used in the formulation L1 of the coating liquid for a white photocurable resin layer in Example 1 was changed to titanium oxide having a primary particle diameter of 0.19 μm (Example 13, a white pigment dispersion 2) and that having a primary particle diameter of 0.25 μm (Example 14, a white pigment dispersion 3), were used instead of the formulation L1 of the coating liquid for a white photocurable resin layer in Example 1. Front plates having formed thereon a decorative layer were formed in the same manner as in Example 1 except that the photosensitive films for forming a decorative layer of Examples 13 and 14 thus produced, and evaluated. The evaluation results are shown in Table 1. Thereafter, front plates 13 and 14, which were capacitance type input devices of Examples 13 and 14, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 13 and 14 having the capacitance type input device as a constitutional element were produced, in the same manner as in Example 1.

The front plate 13, as compared to the front plate 1, was slightly lower in the brightness and the yield, but was practical, and was improved in the missing at the opening and the contamination at the opening. The front plate 13 was equivalent thereto and was practical in the evaluation results of the reticulation, the whiteness, the unevenness, the adhesion of the decorative layer, the development residue and the like.

The front plate 14, as compared to the front plate 1, was slightly lower in the brightness, the whiteness, the yield and the adhesion of the decorative layer, but was practical. The front plate 14 was equivalent thereto and was practical in the other evaluation results.

The front plates were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Example 15

A photosensitive film for forming a decorative layer of Example 15 was produced by using the formulation L1 of the coating liquid for a white photocurable resin layer in Example 1 except that the thickness of the photocurable resin layer formed therewith was changed from 35 μm to 17.5 μm.

In the same manner as in Example 1, the resulting photosensitive film for forming a decorative layer (the photosensitive film of Example 15), from which the cover film was removed, was laminated on a glass substrate having been subjected to the silane coupling treatment with a laminator. Subsequently, the polyethylene terephthalate provisional support was released at the interface to the thermoplastic resin layer to remove the provisional support. Thereafter, a decorative layer was formed in the same manner as in Example 1, and the front plate having formed thereon the decorative layer was evaluated. The evaluation results are shown in Table 1 below. Thereafter, a front plate 15, which was a capacitance type input device of Example 15, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 15 having the capacitance type input device as a constitutional element was produced, in the same manner as in Example 1.

The front plate 15, as compared to the front plate 1, was slightly lower in the brightness and the yield, but was practical, and was improved in the reticulation, the unevenness, the adhesion of the decorative layer, the development residue, the missing at the opening and the contamination at the opening.

The front plate 15 was equivalent thereto and was practical in the evaluation results of the whiteness.

The front plate 15 was free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Example 16

A photosensitive film for forming a decorative layer 16' was produced by using the formulation L1 of the coating liquid for a white photocurable resin layer in Example 1 except that the thickness of the photocurable resin layer formed therewith was changed from 35 μm to 17.5 μm.

In the same manner as in Example 1, the resulting photosensitive film for forming a decorative layer 16', from which the cover film was removed, was laminated on a glass substrate having been subjected to the silane coupling treatment with a laminator. Subsequently, the polyethylene terephthalate provisional support was released at the interface to the thermoplastic resin layer to remove the provisional support.

The photosensitive film was then developed with a triethanolamine developer liquid (which was obtained by diluting 10 times T-PD2, a trade name, produced by Fujifilm Corporation, containing 30% by mass of triethanolamine, with pure water) at 30° C. for 60 seconds at a flat nozzle pressure of 0.1 MPa to remove the thermoplastic resin layer and the intermediate layer. Subsequently, the liquid was drained by blowing air onto the upper surface of the glass substrate, and then the substrate was rinsed with pure water by showering by spraying pure water by showering for 10 seconds, followed by blowing air thereon to reduce the liquid accumulated on the substrate. A silane coupling solution (a 0.3% by mass aqueous solution of N-β-(aminoethyl)-γ-aminopropyltrimethoxysilane, KBM603, a trade name, produced by Shin-Etsu Chemical Co., Ltd.) was sprayed by showering thereon for 20 seconds, followed by rinsing with pure water by showering. The substrate was dried at 100° C. for 5 minutes, and the cover film was removed from the photosensitive film for forming a decorative layer 16' having a decorative layer having a thickness of 17.5 μm, and then again laminated with a laminator. Subsequently, the polyethylene terephthalate provisional support was removed. A photosensitive film for forming a decorative layer 16 having two photocurable resin layers each having a thickness of 17.5 was thus produced. Thereafter, a decorative layer was formed in the same manner as in Example 1, and the front plate having formed thereon the decorative layer was evaluated. The evaluation results are shown in Table 1 below. Thereafter, a front plate 16, which was a capacitance type input device of Example 16, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 16 having the capacitance type input device as a constitutional element was produced, in the same manner as in Example 1.

The front plate 16, as compared to the front plate 1, was slightly lower in the yield, the adhesion of the decorative layer and the missing at the opening, but was practical, and was equivalent thereto and was practical in the evaluation results of the reticulation, the whiteness, the unevenness, the development residue and the like.

The front plate 16 was free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Example 17

A photosensitive film for forming a decorative layer of Example 17 was produced by using the formulation L1 of the coating liquid for a white photocurable resin layer in Example 1 except that the thickness of the photocurable resin layer formed therewith was changed from 35 μm to 6 μm. A front plate 17' having formed thereon a decorative layer was produced in the same manner as in Example 1 except that the photosensitive film for forming a decorative layer of Example 17 thus produced was used. A white screen printing ink S1 was screen-printed on the front plate 17' with a screen printing machine (UDF-5L, produced by Mishima Co., Ltd., mesh size: 250 μm) and dried at 100° C. for 10 minutes to a tack-free state. The ink had a thickness of 6 μm. The screen printing was further performed in the same manner as above, followed by drying at 100° C. for 10 minutes. The operation of printing and drying was repeated 4 times. The photosensitive film was then dried at 150° C. for 30 minutes, and a front plate having the decorative layer formed thereon was evaluated. The results are shown in Table 1 below. Thereafter, a front plate 17, which was a capacitance type input device of Example 17, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 17 having the capacitance type input device as a constitutional element was produced, in the same manner as in Example 1.

| White Screen-printing Ink, Formulation S1 | |
|---|---|
| Random copolymer of benzyl methacrylate/methacrylic acid (molar ratio: 72/28, weight average molecular weight: 30,000), a propylene glycol monomethyl ether acetate solution (solid content: 40.5% by mass) | 331 parts by mass |

| White Screen-printing Ink, Formulation S1 (continued) | |
|---|---|
| White pigment dispersion 1 | 157 parts by mass |
| Surfactant (Megafac F-780F, a trade name, produced by Dainippon Ink And Chemicals, Inc.) | 1.0 part by mass |

The front plate 17, as compared to the front plate 1, was slightly lower in the brightness, the adhesion of the decorative layer, the yield, the unevenness and the contamination at the opening, but was practical, and was improved in the development residue. The front plate 17 was equivalent thereto and was practical in the evaluation results of the reticulation, the whiteness, the missing at the opening, and the like.

The front plate 17 was free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Example 18

A photosensitive film for forming a decorative layer of Example 18 was produced by using the formulation L1 of the coating liquid for a white photocurable resin layer in Example 17 except that the thickness of the layer formed therewith was changed from 6 μm to 2 μm. A front plate 18' having formed thereon a decorative layer was produced in the same manner as in Example 1 except that the photosensitive film for forming a decorative layer of Example 18 thus produced was used. The white screen printing ink S1 was screen-printed on the front plate 18' with a screen printing machine (UDF-5L, produced by Mishima Co., Ltd., mesh size: 250 μm) and dried at 100° C. for 10 minutes to a tack-free state. The ink had a thickness of 6 μm. The screen printing was further performed in the same manner as above, followed by drying at 100° C. for 10 minutes. The operation of printing and drying was repeated 5 times. The photosensitive film was then dried at 150° C. for 30 minutes, and a front plate having the decorative layer formed thereon was evaluated. The results are shown in Table 1 below. Thereafter, a front plate 18, which was a capacitance type input device of Example 18, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 18 having the capacitance type input device as a constitutional element was produced, in the same manner as in Example 1.

The front plate 18, as compared to the front plate 1, was lower in the brightness, the reticulation, the unevenness, the yield, the adhesion of the decorative layer, the missing at the opening, the contamination at the opening, and the yield, but was practical, and was improved in the development residue. The front plate 18 was equivalent thereto and was practical in the evaluation results of the whiteness.

The front plate 18 was free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 19 and 20

Photosensitive films for forming a decorative layer of Examples 19 and 20 were produced in the same manner as in Example 1 except that the formulation L19 (Example 19, initiator: Irgacure OXE-01, produced by BASF Japan Co., Ltd.) and the formulation L20 (Example 20, initiator: Lunar 6, produced by DKSH Japan K.K.) were used instead of the formulation L1 of the coating liquid for a white photocurable resin layer in Example 1, and the species of the initiator, the initiator/monomer ratio and the exposure amount were changed to those shown in Table 1. Front plates having formed thereon a decorative layer were formed in the same manner as in Example 1 except that the photosensitive films for forming a decorative layer of Examples 19 and 20 thus produced, and evaluated. The evaluation results are shown in Table 1. Thereafter, front plates 19 and 20, which were capacitance type input devices of Examples 19 and 20, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 19 and 20 having the capacitance type input device as a constitutional element were produced, in the same manner as in Example 1.

The front plates 19 and 20 were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 1

Toughened glass (300 mm×400 mm×0.7 mm) having an opening (diameter: 15 mm) was rinsed with a UV rinsing equipment, then rinsed with a cleaner and a brush, and further rinsed with super-pure water under application of ultrasonic waves. The substrate was heated-treated at 120° C. for 3 minutes for stabilizing the surface condition. The substrate was cooled and controlled to a temperature of 23° C., the coating liquid L1 for a white photocurable resin layer obtained in Example 1 was coated thereon with a glass substrate coater having a slit nozzle (MH-1600, a trade name, produced by FAS Technologies Japan Co., Ltd.). The coating liquid L1 for a white photocurable resin layer flowed into the opening of the toughened glass and caused contamination at the opening and the back surface of the substrate. Subsequently, the solvent was partially dried with VCD (vacuum dryer, produced by Tokyo Ohka Kogyo Co., Ltd.) to remove the flowability, then the unnecessary coating liquid in the periphery of the substrate was removed with EBR (edge bead remover), and then the substrate was prebaked at 120° C. for 3 minutes, thereby providing a white photocurable resin layer L21 having a thickness of 5.0 μm on the toughened glass (liquid resist method).

The substrate and an exposure mask (which was a quartz exposure mask having a flame pattern) were set up vertically and exposed patternwise at a distance between the surface of the exposure mask and the white photocurable resin layer L21 of 200 μm and an exposure amount of 1,000 mJ/cm$^2$ in a nitrogen atmosphere from the side of the white photocurable resin layer L21 by using a proximity exposure machine having a super-high pressure mercury lamp (produced by Hitachi High-Tech Electronics Engineering Co., Ltd.).

After uniformly wetting the surface of the white photocurable resin layer L21 by spraying pure water from a shower nozzle, a sodium carbonate/potassium hydrogen carbonate developer liquid (which was obtained by diluting 5 times T-CD1, a trade name, produced by Fujifilm Corporation, with pure water) was set to 35° C. and a shower pressure of 0.1 MPa, and the period of time, in which the non-exposed region was completely developed, (hereinafter referred to as a break point) was obtained. The substrate was developed therewith for a developing time that was 1.5 times the break point, followed by rinsing with pure water.

The residue was removed by spraying super-pure water at a pressure of 8 MPa from a super-high pressure rinsing nozzle, and the substrate was post-exposed in the air from both the front and back surfaces thereof at an exposure amount of 1,300 mJ/cm$^2$, and was post-baked in a vacuum oven under a condition of 15 mmHg or less at 240° C. for 30 minutes, thereby providing a front plate having a decorative layer. The front plate having formed thereon the decorative layer was evaluated in the same manner as in Example 1. The evaluation results are shown in Table 1 below. Thereafter, a front plate 21, which was a capacitance type input device of Comparative Example 1, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 21 having the capacitance type input device as a constitutional element was produced, in the same manner as in Example 1.

The front plate 21, as compared to the front plate 1, caused contamination at the opening and the back surface, was necessarily rinsed, had a yield that was largely lowered, and had an insufficient brightness.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 2

In Comparative Example 1, the coating liquid L1 for a white photocurable resin layer obtained in Example 1 was coated 7 times to form a white photocurable resin layer L22 containing seven layers each having a thickness of 5.0 μm the toughened glass (liquid resist method). The front plate having formed thereon the decorative layer was evaluated in the same manner as in Example 1. The evaluation results are shown in Table 1 below. Thereafter, a front plate 22, which was a capacitance type input device of Comparative Example 2, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 22 having the capacitance type input device as a constitutional element was produced, in the same manner as in Comparative Example 1.

The front plate 22, as compared to the front plate 1, caused contamination at the opening and the back surface, was necessarily rinsed, had a yield that was largely lowered, and had an insufficient brightness. The unevenness was further deteriorated as compared to the front plate 21 providing a low yield.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 3

Toughened glass (300 mm×400 mm×0.7 mm) having an opening (diameter: 15 mm) was rinsed with a rotation nylon brush while spraying a glass rinsing liquid controlled to 25° C. by showering thereon for 20 seconds, followed by rinsing with pure water by showering, and then a silane coupling solution (a 0.3% by mass aqueous solution of N-β-(aminoethyl)-γ-aminopropyltrimethoxysilane, KBM603, a trade name, produced by Shin-Etsu Chemical Co., Ltd.) was sprayed by showering thereon for 20 seconds, followed by rinsing with pure water by showering. The substrate was heated to 110° C. for 10 minutes with a substrate preheating equipment and then cooled to room temperature. The white screen printing ink S1 was screen-printed on the front plate having been subjected to the silane coupling treatment with a screen printing machine (UDF-5L, produced by Mishima Co., Ltd., mesh size: 250 μm) and prebaked for drying at 100° C. for 10 minutes to a tack-free state. The ink had a thickness of 6 μm. The substrate was further dried at 150° C. for 30 minutes as final baking to provide a white photocurable resin layer L23. The titanium oxide fine particles used had a primary diameter of 0.20 μm.

The front plate having formed thereon the decorative layer was evaluated in the same manner as in Example 1. The evaluation results are shown in Table 1 below. Thereafter, a front plate 23, which was a capacitance type input device of Comparative Example 3, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 23 having the capacitance type input device as a constitutional element was produced, in the same manner as in Comparative Example 1.

The front plate 23, as compared to the front plate 1, was lower in the brightness and the massing at the opening, and was lower in the yield.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 4

In Comparative Example 3, the screen printing and the prebaking were repeated 6 times, and the final baking was performed to provide a white photocurable resin layer L24 containing six layers each having a thickness of 6.0 μm on the toughened glass. The front plate having formed thereon the decorative layer was evaluated in the same manner as in Example 1. The evaluation results are shown in Table 1 below. Thereafter, a front plate 24, which was a capacitance type input device of Comparative Example 4, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 24 having the capacitance type input device as a constitutional element was produced, in the same manner as in Comparative Example 1.

The front plate 24, as compared to the front plate 1, was lower in the brightness, the reticulation, the unevenness, the adhesion of the decorative layer, the massing at the opening and the contamination at the opening, and was lower in the yield.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Examples 21 and 22

Photosensitive films for forming a decorative layer of Examples 21 and 22 were produced in the same manner as in Example 1 except that formulations L15 and L16 of the coating liquid for a white photocurable resin layer, in which titanium oxide having a primary particle diameter of 0.2 μm used in the formulation L1 of the coating liquid for a white photocurable resin layer in Example 1 was changed to titanium oxide having a primary particle diameter of 0.17 μm (Example 21, a white pigment dispersion 4) and that having a primary particle diameter of 0.35 μm (Example 22, a white pigment dispersion 5), were used instead of the formulation L1 of the coating liquid for a white photocurable resin layer in Example 1. Front plates having formed thereon a decorative layer were formed in the same manner as in Example 1 except that the photosensitive films for forming a decorative layer of Examples 21 and 22 thus produced. The front plates having the decorative layer formed thereon were and evaluated. The evaluation results are shown in Table 1. Thereafter, front plates 25 and 26, which were capacitance type input devices of Examples 21 and 22, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 25 and 26 having the capacitance type input device as a constitutional element were produced, in the same manner as in Example 1.

The front plate 25, as compared to the front plate 1, was lower in the brightness and the yield, but was practical, and was improved in the missing at the opening and the contamination at the opening. The front plate 25 was equivalent thereto and was practical in the evaluation results of the whiteness, the reticulation, the unevenness and the development residue. The front plate 25 was easily rinsed, and were free of a problem of contaminating other members.

The front plate 26, as compared to the front plate 1, was lower in the brightness, the yield and the development residue, but was practical. The front plate 26 was equivalent thereto and was practical in the evaluation results of the whiteness, the reticulation, the unevenness, the missing at the opening and the contamination at the opening. The front plates 25 and 26 were free of contamination in the opening and the back surface, were easily rinsed, and were free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 5

A photosensitive film for forming a decorative layer of Comparative Example 5 was produced by using the formulation L1 of the coating liquid for a white photocurable resin layer in Example 1 except that the thickness of the photocurable resin layer formed therewith was changed from 35 μm to 42 μm.

In the same manner as in Example 1, the resulting photosensitive film for forming a decorative layer 16', from which the cover film was removed, was laminated on a glass substrate having been subjected to the silane coupling treatment with a laminator. Subsequently, the polyethylene terephthalate provisional support was released at the interface to the thermoplastic resin layer to remove the provisional support. Thereafter, a decorative layer was formed in the same manner as in Example 1, and the front plate having formed thereon the decorative layer was evaluated. The evaluation results are shown in Table 1 below. Thereafter, a front plate 27, which was a capacitance type input device of Comparative Example 5, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 27 having the capacitance type input device as a constitutional element was produced, in the same manner as in Example 1.

The front plate 27, as compared to the front plate 1, caused a considerable development residue, providing an unusable level. The front plate 27 was free of contamination in the opening and the back surface, was easily rinsed, and was free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 6

A photosensitive film for forming a decorative layer of Comparative Example 6 was produced in the same manner as in Example 1 except that the formulation L17 was used instead of the formulation L1 of the coating liquid for a white photocurable resin layer in Example 1, and the monomer/binder ratio was changed to those shown in Table 1.

In the same manner as in Example 1, the resulting photosensitive film for forming a decorative layer of Comparative Example 6, from which the cover film was removed, was laminated on a glass substrate having been subjected to the silane coupling treatment with a laminator. Subsequently, the polyethylene terephthalate provisional support was released at the interface to the thermoplastic resin layer to remove the provisional support. Thereafter, a decorative layer was formed in the same manner as in Example 1, and the front plate having formed thereon the decorative layer was evaluated. The evaluation results are shown in Table 1 below. Thereafter, a front plate 28, which was a capacitance type input device of Comparative Example 6, having the decorative layer, the mask layer, the first transparent electrode patterns, the insulating layer pattern, the second transparent electrode patterns, the conductive element other than the first and second transparent electrode patterns, and the transparent protective layer was produced, and an image display apparatus 28 having the capacitance type input device as a constitutional element was produced, in the same manner as in Example 1.

The front plate 28, as compared to the front plate 1, was considerably lower in the adhesion of the decorative layer, the development residue and the missing at the opening, providing an unusable level. The front plate 28 was free of contamination in the opening and the back surface, was easily rinsed, and was free of a problem of contaminating other members.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

Comparative Example 7 and 8

Photosensitive films for forming a decorative layer of Comparative Examples 7 and 8 were produced in the same manner as in Example 1 except that the formulations L18 and L19 were used instead of the formulation L1 of the coating liquid for a white photocurable resin layer in Example 1, and the titanium oxide content/solid content ratio was changed to those shown in Table 1.

In the same manner as in Example 1, the resulting photosensitive films for forming a decorative layer of Comparative Examples 7 and 8, from which the cover film was removed, were laminated on a glass substrate having been subjected to the silane coupling treatment with a laminator. Subsequently, the polyethylene terephthalate provisional support was released at the interface to the thermoplastic resin layer to remove the provisional support. Thereafter, a decorative layer was formed in the same manner as in Example 1, and the front plate having formed thereon the decorative layer was evaluated. The evaluation results are shown in Table 1 below. Thereafter, front plates 29 and 30, which were capacitance type input devices of Comparative Examples 7 and 8, having the decorative layer, the mask layer, the first transparent electrode patterns, the insulating layer pattern, the second transparent electrode patterns, the conductive element other than the first and second transparent electrode patterns, and the transparent protective layer were produced, and image display apparatuses 29 and 30 having the capacitance type input devices respectively as a constitutional element were produced, in the same manner as in Example 1.

The front plate 29, as compared to the front plate 1, was considerably lower in the adhesion of the decorative layer, the development residue and the missing at the opening, providing an unusable level. The front plate 28 was free of contamination in the opening and the back surface, was easily rinsed, and was free of a problem of contaminating other members. The front plate 30, as compared to the front plate 1, was considerably lower in the whiteness, the reticulation and the contamination at the opening, providing an unusable level. The front plate 30 was free of contamination in the back surface, but was necessarily rinsed due to the contamination in the opening.

The mask layer was free of pinhole and was excellent in light shielding property.

The first transparent electrode patterns, the second transparent electrode patterns, and the conductive element other than them each were free of problem in conductivity, and the first transparent electrode patterns and the second transparent electrode patterns were insulated from each other.

Furthermore, the transparent protective layer was free of defects, such as bubbles, and an image display apparatus excellent in display characteristics was obtained.

TABLE 1

| | Photosensitive film for forming decorative layer | | | | | | |
|---|---|---|---|---|---|---|---|
| | Composition of photocurable layer | | | | | | |
| | Titanium oxide/ total solid content (% by mass) | Primary particle diameter | Monomer/binder solid content | Species of initiator | Initiator/ monomer | Thickness of photocurable resin layer | Evaluation Transfer property |
| Example 1 | 44 | 0.2 μm | 0.77 | Irgacure 907 | 10.75% | 35 μm | A |
| Example 2 | | | Photosensitive film of Example 1 | | | | A |
| Example 3 | 44 | 0.2 μm | 0.94 | Irgacure 907 | 10.75% | 35 μm | B |
| Example 4 | 44 | 0.2 μm | 0.6 | Irgacure 907 | 10.75% | 35 μm | B |
| Example 5 | 20 | 0.2 μm | 0.77 | Irgacure 907 | 10.75% | 35 μm | A |
| Example 6 | 26 | 0.2 μm | 0.77 | Irgacure 907 | 10.75% | 35 μm | A |
| Example 7 | 32 | 0.2 μm | 0.77 | Irgacure 907 | 10.75% | 35 μm | A |
| Example 8 | 38 | 0.2 μm | 0.77 | Irgacure 907 | 10.75% | 35 μm | A |
| Example 9 | 60 | 0.2 μm | 0.77 | Irgacure 907 | 10.75% | 35 μm | B |
| Example 10 | 75 | 0.2 μm | 0.77 | Irgacure 907 | 10.75% | 35 μm | C |
| Example 11 | 44 | 0.2 μm | 0.77 | Irgacure 127 | 10.75% | 35 μm | A |
| Example 12 | 44 | 0.2 μm | 0.77 | Lunar 6 | 1.34% | 35 μm | A |
| Example 13 | 44 | 0.19 μm | 0.77 | Irgacure 907 | 10.75% | 35 μm | A |
| Example 14 | 44 | 0.25 μm | 0.77 | Irgacure 907 | 10.75% | 35 μm | A |
| Example 15 | 44 | 0.2 μm | 0.77 | Irgacure 907 | 10.75% | 17.5 μm | A |
| Example 16 | 44 | 0.2 μm | 0.77 | Irgacure 907 | 10.75% | 17.5 μm × 2 | A |
| Example 17 | 44 | 0.2 μm | 0.77 | Irgacure 907 | 10.75% | 6 μm | A |
| Example 18 | 44 | 0.2 μm | 0.77 | Irgacure 907 | 10.75% | 2 μm | A |
| Example 19 | 44 | 0.2 μm | 0.77 | OXE01 | 0.336% | 35 μm | A |
| Example 20 | 44 | 0.2 μm | 0.77 | Lunar 6 | 0.336% | 35 μm | A |
| Comparative Example 1 | | | not used | | | | — |
| Comparative Example 2 | | | not used | | | | — |
| Comparative Example 3 | | | not used | | | | — |
| Comparative Example 4 | | | not used | | | | — |
| Example 21 | 44 | 0.17 μm | 0.77 | Irgacure 907 | 10.75% | 35 μm | A |
| Example 22 | 44 | 0.3 μm | 0.77 | Irgacure 907 | 10.75% | 35 μm | A |
| Comparative Example 5 | 44 | 0.2 μm | 0.77 | Irgacure 907 | 10.75% | 42 μm | C |
| Comparative Example 6 | 44 | 0.2 μm | 0.48 | Irgacure 907 | 10.75% | 35 μm | D |
| Comparative | 80 | 0.2 μm | 0.77 | Irgacure 907 | 10.75% | 35 μm | D |

TABLE 1-continued

| | | | | | | | |
|---|---|---|---|---|---|---|---|
| Example 7 Comparative Example 8 | 18 | 0.2 μm | 0.77 | Irgacure 907 | 10.75% | 35 μm | A |

Front plate having decorative layer

| | Production method | Total thickness of decorative layer | Titanium oxide/total solid content in decorative layer | Exposure amount | Brightness | Whiteness | Leticulation |
|---|---|---|---|---|---|---|---|
| Example 1 | transfer method | 35 μm | 44 wt % | 1,000 mJ | A | B | B |
| Example 2 | transfer method | 35 μm | 44 wt % | 1,000 mJ | A | B | B |
| Example 3 | transfer method | 35 μm | 44 wt % | 1,000 mJ | C | C | C |
| Example 4 | transfer method | 35 μm | 44 wt % | 1,000 mJ | A | B | A |
| Example 5 | transfer method | 35 μm | 20 wt % | 1,000 mJ | C | C | C |
| Example 6 | transfer method | 35 μm | 26 wt % | 1,000 mJ | B | C | C |
| Example 7 | transfer method | 35 μm | 32 wt % | 1,000 mJ | B | B | B |
| Example 8 | transfer method | 35 μm | 38 wt % | 1,000 mJ | A | B | B |
| Example 9 | transfer method | 35 μm | 60 wt % | 1,000 mJ | A | A | A |
| Example 10 | transfer method | 35 μm | 75 wt % | 1,000 mJ | B | A | A |
| Example 11 | transfer method | 35 μm | 44 wt % | 2,000 mJ | A | A | C |
| Example 12 | transfer method | 35 μm | 44 wt % | 1,000 mJ | A | A | A |
| Example 13 | transfer method | 35 μm | 44 wt % | 1,000 mJ | B | B | B |
| Example 14 | transfer method | 35 μm | 44 wt % | 1,000 mJ | C | C | B |
| Example 15 | transfer method | 17.5 μm | 44 wt % | 1,000 mJ | C | B | A |
| Example 16 | transfer method (twice) | 17.5 μm × 2 | 44 wt % | 1,000 mJ | A | B | B |
| Example 17 | transfer method + screen printing | Transfer 6 μm + printing 6 μm × 4 | 44 wt % | 1,000 mJ | B | B | B |
| Example 18 | transfer method + screen printing | Transfer 2 μm + printing 6 μm × 5 | 44 wt % | 1,000 mJ | B | B | C |
| Example 19 | transfer method | 35 μm | 44 wt % | 1,000 mJ | A | A | A |
| Example 20 | transfer method | 35 μm | 44 wt % | 1,000 mJ | A | A | A |
| Comparative Example 1 | slit coating | 5 μm | 44 wt % | 1,000 mJ | E | B | B |
| Comparative Example 2 | slit coating | 5 μm × 7 | 44 wt % | 1,000 mJ | C | C | D |
| Comparative Example 3 | screen printing | 6 μm | 44 wt % | — | E | A | B |
| Comparative Example 4 | screen printing | 6 μm × 6 | 44 wt % | — | B | B | D |
| Example 21 | transfer method | 35 μm | 44 wt % | 1,000 mJ | D | B | B |
| Example 22 | transfer method | 35 μm | 44 wt % | 1,000 mJ | D | B | B |
| Comparative Example 5 | transfer method | 42 μm | 44 wt % | 1,000 mJ | A | C | B |
| Comparative Example 6 | transfer method | 35 μm | 44 wt % | 1,000 mJ | A | B | A |
| Comparative Example 7 | transfer method | 35 μm | 80 wt % | 1,000 mJ | C | B | A |
| Comparative | transfer | 35 μm | 18 wt % | 1,000 mJ | C | D | D |

TABLE 1-continued

| | | Front plate having decorative layer Evaluation | | | | |
|---|---|---|---|---|---|---|
| Example 8 method | Yield | Adhesion of decorative layer | Development residue | Unevenness | Contamination at opening | Missing at opening |
| Example 1 | A | B | B | B | B | B |
| Example 2 | A | B | B | B | B | B |
| Example 3 | B | A | A | C | C | A |
| Example 4 | B | C | C | A | A | C |
| Example 5 | B | A | A | C | C | A |
| Example 6 | B | A | A | C | C | A |
| Example 7 | B | B | B | B | B | B |
| Example 8 | B | B | B | B | B | B |
| Example 9 | B | B | B | A | A | B |
| Example 10 | B | C | C | A | A | C |
| Example 11 | B | C | B | B | B | B |
| Example 12 | B | A | B | B | B | B |
| Example 13 | B | B | B | B | A | A |
| Example 14 | B | C | B | B | B | B |
| Example 15 | B | A | A | A | A | A |
| Example 16 | B | C | B | B | B | C |
| Example 17 | C | C | A | C | C | B |
| Example 18 | C | C | A | C | C | C |
| Example 19 | B | A | B | B | B | C |
| Example 20 | B | A | B | B | B | B |
| Comparative Example 1 | D | B | A | C | E | A |
| Comparative Example 2 | E | C | B | E | E | A |
| Comparative Example 3 | C | B | — | B | B | C |
| Comparative Example 4 | D | C | — | D | D | D |
| Example 21 | B | A | B | B | A | A |
| Example 22 | B | B | C | B | B | B |
| Comparative Example 5 | B | C | D | B | B | C |
| Comparative Example 6 | C | D | D | B | A | D |
| Comparative Example 7 | C | D | D | A | A | D |
| Comparative Example 8 | C | A | A | D | D | A |

It was understood from Table 1 that the use of the photosensitive film of the invention provided a white decorative layer that is good in the brightness, the whiteness, the reticulation, the adhesion, the development residue and the unevenness, in a high yield.

As described above, according to the method for producing a capacitance type input device of the invention was capable of producing a capacitance type input device capable of being advantageously reduced in thickness and weight through a convenient process with high quality. It was thus understood that a capacitance type input device that is produced by the production method of the invention, and an image display apparatus that uses the capacitance type input device had high quality.

It was understood that according to the preferred embodiments of the method for producing a capacitance type input device of the invention, protrusion of a resist and contamination in a back surface of a substrate were reduced even when a substrate having an opening was used.

While the present invention has been described in detail and with reference to specific embodiments thereof, it will be apparent to one skilled in the art that various changes and modifications can be made therein without departing from the spirit and scope thereof.

The present disclosure relates to the subject matter contained in International Application No. PCT/JP2013/056736, filed Mar. 12, 2013, and Japanese Application No. 2012-058243, filed Mar. 15, 2012, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

REFERENCE SIGN LIST

1 front plate
2a decorative layer
2b mask layer
3 first transparent electrode patterns
3a pad portion
3b connecting portion 4 second transparent electrode patterns
5 insulating layer
6 conductive element
7 transparent protective layer
8 opening
10 capacitance type input device
11 toughened glass
12 another conductive element
21 provisional support
22 thermoplastic resin layer
23 intermediate layer
24 colored layer
25 cover film
31 non-image region
32 image region
33 blade
C first direction
D second direction

What is claimed is:

1. A photosensitive film comprising a provisional support and a photocurable resin layer, wherein:
   the photocurable resin layer contains (A) a white inorganic pigment, (B) a monomer, (C) a binder and (D) a photopolymerization initiator,
   the photocurable resin layer has a thickness of from 1 to 40 μm,
   the photocurable resin layer has a content of the white inorganic pigment of from 32 to 50% by mass based on the total solids content thereof,
   the average particle diameter of primary particles of the white inorganic pigment is from 0.18 to 0.27 μm, and
   the content ratio B/C of the solids content of the monomer (B) to the solids content of the binder (C) is 0.58 to 0.95.

2. The photosensitive film according to claim 1, wherein the white inorganic pigment is rutile titanium oxide.

3. The photosensitive film according to claim 1, which further comprises a thermoplastic resin layer between the provisional support and the photocurable resin layer.

4. A capacitance type input device containing a front plate and on a non-contact surface thereof the following components (1) and (3) to (5):
   (1) a decorative layer,
   (3) plural first transparent electrode patterns that contain plural pad portions that are formed to extend in a first direction and connected through connecting portions,
   (4) plural second electrode patterns that are electrically insulated from the first transparent electrode patterns, and contain plural pad portions that are formed to extend in a direction intersecting the first direction, and
   (5) an insulating layer that electrically insulates the first transparent electrode patterns and the second electrode patterns from each other,
   the capacitance type input device being produced by forming the decorative layer (1) by transferring a colored layer of a photosensitive film to the non-contact surface of the front plate,
   the photosensitive film comprising a provisional support and a photocurable resin layer,
   wherein the photocurable resin layer contains (A) a white inorganic pigment, (B) a monomer, (C) a binder and (D) a photopolymerization initiator; the photocurable resin layer has a thickness of from 1 to 40 μm; the photocurable resin layer has a content of the white inorganic pigment of from 32 to 50% by mass based on the total solids content thereof; the average particle diameter of primary particles of the white inorganic pigment is from 0.18 to 0.27 μm; and the content ratio B/C of the solids content of the monomer (B) to the solids content of the binder (C) is 0.58 to 0.95.

5. An image display apparatus comprising the capacitance type input device according to claim 4 as a constitutional component.

6. The photosensitive film according to claim 1, wherein the content ratio B/C of the solids content of the monomer (B) to the solids content of the binder (C) is 0.58 to 0.77.

* * * * *